US012255091B2

(12) United States Patent
Hung et al.

(10) Patent No.: US 12,255,091 B2
(45) Date of Patent: *Mar. 18, 2025

(54) SEMICONDUCTOR PROCESSING APPARATUS AND METHOD UTILIZING ELECTROSTATIC DISCHARGE (ESD) PREVENTION LAYER

(71) Applicant: Taiwan Semiconductor Manufacturing Co., Ltd., Hsinchu (TW)

(72) Inventors: Tsai-Hao Hung, Hsinchu (TW); Ping-Cheng Ko, Hsinchu (TW); Tzu-Yang Lin, Hsinchu (TW); Fang-Yu Liu, Hsinchu (TW); Cheng-Han Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,703

(22) Filed: Nov. 21, 2023

(65) Prior Publication Data

US 2024/0087945 A1 Mar. 14, 2024

Related U.S. Application Data

(63) Continuation of application No. 18/055,784, filed on Nov. 15, 2022, now Pat. No. 11,854,860, which is a
(Continued)

(51) Int. Cl.
*H01L 21/687* (2006.01)
*H01L 21/66* (2006.01)
(Continued)

(52) U.S. Cl.
CPC .. *H01L 21/68757* (2013.01); *H01L 21/67167* (2013.01); *H01L 21/67173* (2013.01);
(Continued)

(58) Field of Classification Search
CPC ......... H01L 21/68757; H01L 21/67167; H01L 21/67173; H01L 21/6719; H01L 21/67196;
(Continued)

(56) References Cited

U.S. PATENT DOCUMENTS 6,018,189 A * 1/2000 Mizuno ............. H01L 23/49548
257/676
6,560,105 B1 5/2003 Roy et al.
(Continued)

FOREIGN PATENT DOCUMENTS

CN 103314433 A 9/2013
CN 107039308 A 8/2017
(Continued)

*Primary Examiner* — Vu A Vu
(74) *Attorney, Agent, or Firm* — Seed IP Law Group LLP

(57) ABSTRACT

Semiconductor processing apparatuses and methods are provided in which an electrostatic discharge (ESD) prevention layer is utilized to prevent or reduce ESD events from occurring between a semiconductor wafer and one or more components of the apparatuses. In some embodiments, a semiconductor processing apparatus includes a wafer handling structure that is configured to support a semiconductor wafer during processing of the semiconductor wafer. The apparatus further includes an ESD prevention layer on the wafer handling structure. The ESD prevention layer includes a first material and a second material, and the second material has an electrical conductivity that is greater than an electrical conductivity of the first material.

20 Claims, 8 Drawing Sheets

Related U.S. Application Data continuation of application No. 17/182,782, filed on Feb. 23, 2021, now Pat. No. 11,532,499, which is a continuation of application No. 16/559,089, filed on Sep. 3, 2019, now Pat. No. 10,950,485.

(60) Provisional application No. 62/835,365, filed on Apr. 17, 2019.

(51) Int. Cl.
*H01L 21/67* (2006.01)
*H01L 21/677* (2006.01)
*H05F 1/00* (2006.01)

(52) U.S. Cl.
CPC .... *H01L 21/6719* (2013.01); *H01L 21/67196* (2013.01); *H01L 21/67201* (2013.01); *H01L 21/67242* (2013.01); *H01L 21/67742* (2013.01); *H01L 22/10* (2013.01); *H05F 1/00* (2013.01)

(58) Field of Classification Search
CPC ......... H01L 21/67201; H01L 21/67242; H01L 21/67742; H01L 22/10; H01L 21/67161; H01L 21/67396; H01L 21/67772; H01L 21/687; H01L 21/68707; H05F 1/00; H01J 37/026; H01J 37/32697; H05K 9/0067
USPC .......................................................... 438/14
See application file for complete search history.

(56) References Cited

U.S. PATENT DOCUMENTS

| | | | | |
|---|---|---|---|---|
| 7,067,178 B2* | 6/2006 | Muto | ................ | H01L 21/68757 |
| | | | | 118/728 |
| 7,547,978 B2* | 6/2009 | Hembree | .............. | H01L 24/743 |
| | | | | 257/725 |
| 8,398,673 B2* | 3/2013 | Hinchliffe | .......... | A61B 17/1608 |
| | | | | 606/205 |
| 8,426,889 B2* | 4/2013 | Adachi | .................. | H02H 9/044 |
| | | | | 257/693 |
| 8,455,918 B2* | 6/2013 | Adachi | ..................... | H01T 1/20 |
| | | | | 361/220 |
| 8,724,284 B2* | 5/2014 | Umeda | ................ | H05K 9/0067 |
| | | | | 361/220 |
| 9,698,109 B2* | 7/2017 | Tsukizawa | ............... | H01B 1/16 |
| 9,741,710 B2 | 8/2017 | Cho et al. | | |
| 9,954,510 B2* | 4/2018 | Park | ..................... | H01F 27/2823 |
| 10,950,485 B2 | 3/2021 | Hung et al. | | |
| 11,532,499 B2 | 12/2022 | Hung | | |
| 11,735,448 B2* | 8/2023 | Toyomaki | ............. | B65G 47/90 |
| | | | | 414/217 |
| 11,854,860 B2* | 12/2023 | Hung | ................ | H01L 21/67742 |
| 2012/0211029 A1 | 8/2012 | Pandit et al. | | |
| 2013/0334713 A1* | 12/2013 | Xu | ........................ | H01L 21/304 |
| | | | | 438/464 |
| 2016/0029479 A1* | 1/2016 | Yoo | ...................... | H05K 1/0259 |
| | | | | 361/56 |
| 2016/0156326 A1* | 6/2016 | Park | ..................... | H01F 27/2823 |
| | | | | 333/185 |
| 2017/0117170 A1* | 4/2017 | Wong | ................ | H01L 21/67303 |
| 2017/0358476 A1 | 12/2017 | Horiuchi et al. | | |

FOREIGN PATENT DOCUMENTS

| | | |
|---|---|---|
| JP | 2005510868 A | 4/2005 |
| JP | 2012160491 A | 8/2012 |
| KR | 1020010052267 A | 6/2001 |
| KR | 1020130138882 A | 12/2013 |
| TW | 406344 B | 9/2000 |
| TW | 200301009 A | 6/2003 |
| TW | 201345673 B | 11/2013 |
| TW | 550646 B | 9/2023 |

* cited by examiner

SEMICONDUCTOR PROCESSING APPARATUS AND METHOD UTILIZING ELECTROSTATIC DISCHARGE (ESD) PREVENTION LAYER

BACKGROUND

A variety of processes are performed in the fabrication of semiconductor devices. During the fabrication of semiconductor devices, semiconductor wafers are processed in a variety of different processing tools or apparatuses. In many such semiconductor processing apparatuses, static charge can develop during the processing of the wafer. Static electricity or static charge generally refers to an imbalance of electrical charges within or on the surface of a material. This imbalance of electrons can produce an electric field that can influence other objects. Electrostatic discharge (ESD) is a rapid, spontaneous transfer of electrostatic charge induced by a high electrostatic field, and can manifest as a spark between two bodies at different electrostatic potentials.

Electrostatic discharge can change the electrical characteristics of a semiconductor device, which can degrade or destroy the device. Electrostatic discharge also may upset the normal operation of an electronic system, such as may be included in semiconductor manufacturing or processing apparatuses, causing equipment malfunction or failure.

As electronic devices become faster and the circuitry becomes smaller, sensitivity to ESD increases in such electronic devices. Accordingly, ESD may negatively affect production yields, manufacturing cost, product quality, product reliability, and profitability.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
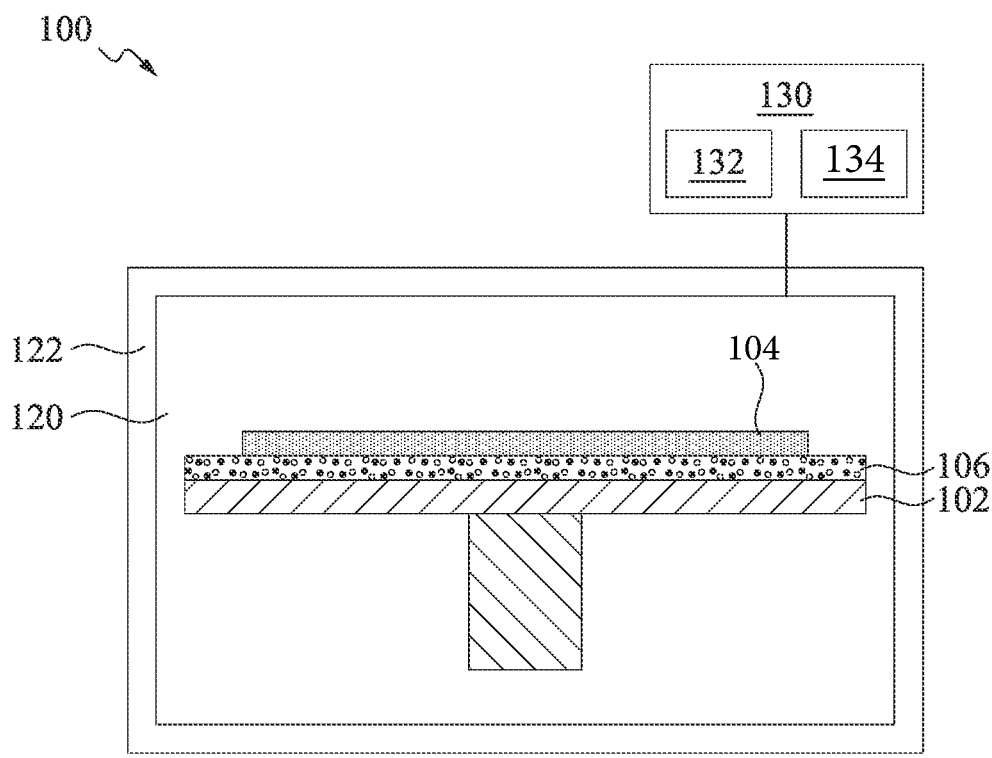
FIG. 1 is a schematic diagram illustrating a semiconductor processing apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The problems caused by electrostatic charge in semiconductor manufacturing can lead to reductions in quality and yield of resulting semiconductor devices. ESD in a semiconductor manufacturing or processing environment can damage semiconductor wafers, photomasks, and other components within the manufacturing or processing environment. ESD can also produce unwanted electrical signals (e.g., electromagnetic interference) that can interfere with the operation of the semiconductor processing apparatuses or equipment.

Embodiments provided herein include an electrostatic discharge (ESD) prevention layer and methods that facilitate prevention or reduction of ESD, for example, during processing of a semiconductor wafer in any semiconductor processing apparatus. In some embodiments, the ESD prevention layer may be a composite film including a first material that is electrically insulating, and a second material that is electrically conductive. The ESD prevention layer may be applied to any component or portion of a semiconductor processing apparatus which contacts a semiconductor wafer during processing. For example, the ESD prevention layer may be applied to a wafer stage, a robot arm, a load/unload port, or the like.

FIG. 1 is a schematic diagram illustrating a semiconductor processing apparatus 100, in accordance with one or more embodiments of the present disclosure. The semiconductor processing apparatus 100 illustrated in FIG. 1 may be, for example, a plasma-related semiconductor processing tool, such as a plasma etching tool or a plasma deposition tool; however, embodiments of the present disclosure are not limited thereto. In various embodiments, the semiconductor processing apparatus 100 may be any apparatus or processing tool which is utilized in the processing of semiconductor devices.

The semiconductor processing apparatus 100 includes a wafer stage 102 on which a semiconductor wafer 104 is positioned during a semiconductor manufacturing process, such as an etching or deposition process. The wafer 104 may be a semiconductor wafer, which in some embodiments may include electrical features on a front side (e.g., the upper side as illustrated in FIG. 1) of the wafer 104. In some embodiments, the wafer 104 may be a monocrystalline silicon (Si) wafer, an amorphous Si wafer, a gallium arsenide (GaAs) wafer, or any other semiconductor wafer.

In an example in which the semiconductor processing apparatus 100 is a plasma etching tool, the semiconductor processing apparatus 100 may be configured to generate a high-speed stream of plasma (e.g., charged ions) of a desired gas mixture and to direct the plasma stream to the wafer 104. The plasma generates volatile etch products at room temperature from the chemical reactions between the elements of the material etched (e.g., the surface of the wafer 104) and the reactive species generated by the plasma. Based on the type of plasma and the type of material on the wafer 104, the collision of the charged particles of the plasma with the material of the wafer 104 dislodges that material, effectively removing it from the surface of the wafer 104. Other types of plasma etching may be used in accordance with principles described herein.

In an example in which the semiconductor processing apparatus 100 is a plasma deposition tool, the semiconductor processing apparatus 100 may be configured to perform plasma deposition processes. One example of such a process is a Plasma Enhanced Chemical Vapor Deposition (PECVD) process. A conventional Chemical Vapor Deposition (CVD) process involves exposing a substrate (e.g., the wafer 104) to a volatile precursor gas, which reacts with the substrate to deposit material onto the substrate. A PECVD process uses plasma to enhance the CVD process by increasing the reaction rate.

Another plasma-related deposition process includes a Physical Vapor Deposition (PVD) process, which may also be referred to as sputtering. A PVD process involves bombarding a target material with plasma, which causes sputtering away of some of the target material as a vapor which is deposited onto a substrate, such as the wafer 104.

The wafer stage 102 is located within a process chamber 120 of the semiconductor processing apparatus 100. The process chamber 120 may be at least partially surrounded by a housing 122. For example, the process chamber 120 may be enclosed within the housing 122.

In various embodiments, additional components may be located within the process chamber 120, depending on a type of semiconductor process that is implemented by the semiconductor processing apparatus 100. For example, in some embodiments, one or more electrodes are located within the process chamber 120 and are configured to create an electromagnetic field which creates plasma from a precursor gas that is injected into the process chamber 120. In such embodiments, a lower electrode may be positioned below the semiconductor wafer 104, and an upper electrode may be positioned above the semiconductor wafer 104.

In some embodiments, for example, in embodiments where the semiconductor processing apparatus 100 implements a PVD process, a target material may be located within the process chamber 120 and positioned over the semiconductor wafer 104 so that sputtering of the target material may be deposited onto the wafer 104.

The process chamber 120 may include one or more fluid inlets or outlets for receiving or exhausting fluids. For example, the process chamber 120 may be in fluid communication with gas sources which provide various precursor gases to the process chamber 120 for the various fabrication processes that are performed by the semiconductor processing apparatus 100. In some embodiments, the process chamber 120 may be a vacuum chamber, and the process chamber 120 may be in fluid communication with a negative pressure or vacuum in order to purge gas from the chamber.

As described previously herein, the semiconductor processing apparatus 100 may be any apparatus or processing tool which is utilized in the processing of semiconductor devices. Similarly, the process chamber 120 is an example of a process chamber which may be utilized in the semiconductor processing apparatus 100; however, embodiments provided herein are not limited to the process chamber 120 illustrated in FIG. 1. In various embodiments, any components or features which may be utilized in any of a variety of semiconductor processing tools may be located within or associated with the process chamber 120.

In some embodiments, the semiconductor processing apparatus 100 includes a control system 130 that controls one or more operations of the semiconductor processing apparatus 100. For example, in various embodiments, the control system 130 may control generation of plasma, flows of fluid into or out of the process chamber 120, electrical energy applied to one or more electrodes within the process chamber 120, heating or other environmental parameters of the process chamber 120, or the like. In some embodiments, the control system 130 may control operations of one or more robotic mechanisms, such as a robotic arm or movable robotic structure which may be manipulated to move a semiconductor wafer 104 onto or off of the wafer stage 102.

The control system 130 may include a processor 132 and a computer-readable memory 134. The memory 134 may include machine readable instructions that when executed by the processor 132, cause the control system 130 to send command signals to the one or more components of the semiconductor processing apparatus 100, such as a plasma generation component, gas inlet or outlet mechanisms, one or more electrodes, or the like.

The wafer stage 102 is configured to support the semiconductor wafer 104 during processing of the wafer 104 in the semiconductor processing apparatus 100. The wafer stage 102 may be any structure that supports, holds, or secures the wafer 104 during processing. The wafer stage 102 is provided as an example of a wafer handling structure. A wafer handling structure, as referred to herein, may be any structure of a semiconductor manufacturing apparatus or tool which supports, secures, moves, or otherwise handles a semiconductor wafer during processing of the wafer. Embodiments of the present disclosure are therefore not limited to the use of a wafer stage 102 as a wafer handling structure. Rather, as will be described in further detail herein, any wafer handling structure may be utilized in connection with the various embodiments of the present disclosure.

In some embodiments, the semiconductor wafer 104 may be placed on the wafer stage 102 by a movable wafer handling structure, such as a robotic arm or any movable robotic structure capable of securing and transporting the semiconductor wafer 104 to the wafer stage 102. The movable wafer handling structure, such as a robotic arm, may similarly remove the semiconductor wafer 104 and transport the wafer 104 to another location, such as to a buffer chamber, another process chamber, a transfer chamber, or the like, after the semiconductor wafer 104 has been processed in the process chamber 120.

An electrostatic discharge (ESD) prevention layer 106 is disposed on a surface of the wafer handling structure. For example, as shown in FIG. 1, the ESD prevention layer 106 may be positioned on a surface of the wafer stage 102, such as on an upper surface of the wafer stage 102. In use of the semiconductor processing apparatus 100, the ESD prevention layer 106 prevents ESD from occurring between the semiconductor wafer 104 and the wafer handling structure, e.g., the wafer stage 102. For example, the ESD prevention layer 106 may be electrostatically dissipative and may dissipate static charge which may accumulate between the semiconductor wafer 104 and the wafer stage 102 due to, for example, separating the wafer 104 from the wafer stage 102, the presence of charged particles within the process chamber 120, or any other cause of static charge. By preventing electrostatic discharge between the semiconductor wafer 104 and the wafer stage 102, the various electrical features or components which are formed on the semiconductor wafer 104 may be protected, thereby decreasing defects and increasing yield of semiconductor devices which are manufactured from the wafer 104.

The ESD prevention layer 106 may cover an entire surface of the wafer stage 102. For example, as shown in FIG. 1, the ESD prevention layer 106 may cover an entire upper surface of the wafer stage 102, so that no portion of the upper surface of the wafer stage 102 is exposed. This prevents direct contact between the semiconductor wafer 104 and the surface of the wafer stage 102. In some embodiments, the ESD prevention layer 106 may cover only a portion of a surface of the wafer stage 102. For example, the ESD prevention layer 106 may be provided on only a portion of the wafer stage 102 which supports the wafer 104, such as a central portion of an upper surface of the wafer stage 102. In some embodiments, the ESD prevention layer 106 may completely cover a surface of the wafer stage 102 (e.g., an upper surface) and may further extend over adjacent surfaces (e.g., side surfaces) of the wafer stage 102.

Figure 2:
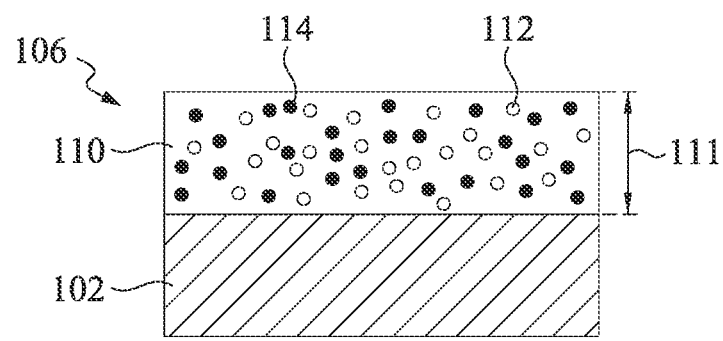
FIG. 2 is a cross-sectional view illustrating further details of an electrostatic discharge (ESD) prevention layer, in accordance with some embodiments.

FIG. 2 is a cross-sectional view illustrating further details of the ESD prevention layer 106, in accordance with one or more embodiments of the present disclosure.

As shown in FIG. 2, the ESD prevention layer 106 may be a composite layer that includes a first material 110 and a second material 112. The first material 110 may be a base material, while the second material 112 may be mixed into, implanted, or embedded within the first material 110. In some embodiments, the second material 112 has an electrical conductivity that is greater than an electrical conductivity of the first material 110. This increases the overall conductivity of the composite ESD prevention layer 106, thereby increasing its ability to dissipate electrostatic charges.

In some embodiments, the first material 110 is at least one of a polymer (e.g., plastic) or a resin material. Plastic and resin materials may be particularly suitable for contacting or supporting semiconductor wafers during semiconductor applications as they have, or can be made to have, properties which are suitable to withstand various conditions which may be encountered within semiconductor processing apparatuses. For example, plastic and resin materials may generally withstand repeated temperature swings (e.g., high and low process temperatures) without breaking down. Moreover, plastic and resin materials generally have properties which prevent or resist sliding of a semiconductor wafer when the semiconductor wafer is positioned on such plastic and resin materials. For example, plastic and resin materials may have a coefficient of friction which is suitable to prevent a semiconductor wafer from sliding under normal process conditions which may be experienced in the semiconductor processing apparatus 100. Plastic and resin materials are typically electrical insulators, and thus, the first material 110 may be an electrically insulating material such as a plastic or resin material. The second material 112 is an electrically conductive material, which increases the overall electrical conductivity of the ESD prevention layer 106, such that the ESD prevention layer 106 has a conductivity that is suitable to dissipate electrostatic charges.

In some embodiments, the first material 110 may include one or more of Polyetheretherketone (PEEK), Polytetrafluoroethylene (PTFE), or polyimide (PI).

In some embodiments, the second material 112 includes conductive particles, which may be any particles that are electrically conductive, or which have an electrical conductivity that is greater than an electrical conductivity of the first material 110 (e.g., a plastic or resin material). For example, the second material 112 may be metallic particles which are mixed into the first material 110. In various embodiments, the second material 112 may be titanium (Ti) particles, aluminum (Al) particles, copper (Cu) particles, gold (Au) particles, silver (Ag) particles, or any other metallic particles or any particles of a conductive alloy. In some embodiments, the second material 112 may be any metal compound particle, including, for example, titanium nitride (TiN), silicon copper (SiCu), aluminum silicon (AlSi), or any other metal compound particle having an electrical conductivity that is greater than an electrical conductivity of the first material 110.

In some embodiments, the second material 112 may be conductive particles that have a size that is less than about 10 μm. In some embodiments, the conductive particles of the second material 112 may have a size that is less than about 1 μm. In some embodiments, the conductive particles of the second material 112 may have a size that is less than about 500 nm. The size of the conductive particles may refer to any dimension of the conductive particles, including, for example, thickness, height, width, diameter, or the like. In some embodiments, the second material 112 may be microspheres or nanospheres having a diameter that is less than about 1 μm.

The second material 112 may have a size that is less than a thickness 111 of the first material 110. For example, in some embodiments, the first material 110 has a thickness that is equal to or greater than 1 μm, and the second material 112 has a size (e.g., a thickness, height, width, diameter, etc.) that is less than 1 μm.

The ESD prevention layer 106 may be a homogenous mixture of the first material 110 and the second material 112. For example, the second material 112 (e.g., conductive particles) may be uniformly distributed throughout the first material 110. The ESD prevention layer 106 may have a same proportion of the first and second materials 110, 112 through any given sample of the ESD prevention layer 106.

Relative amounts of the first and second materials 110, 112 may differ in various embodiments. In some embodiments, a ratio of the volume of the first material 110 to the volume of the second material 112 within the ESD prevention layer 106 may be less than 1:1. That is, in some embodiments, the second material 112 may occupy a greater overall volume within the ESD prevention layer 106 than does the first material 110. In some embodiments, the second material 112 may occupy greater than 50% of the total volume of the ESD prevention layer 106, and in some embodiments, the second material 112 may occupy about 60% to about 80% of the total volume of the ESD prevention layer 106. In some embodiments, the second material 112 may occupy about 75% of the total volume of the ESD prevention layer. The relative amount (e.g., volume) of the second material 112 within the ESD prevention layer 106 is an important factor in determining the overall conductivity of the ESD prevention layer 106 and the ability of the ESD prevention layer 106 to suitably dissipate electrostatic charges without ESD events occurring between the semiconductor wafer 104 and a wafer handling structure, such as the wafer stage 102.

In some embodiments, the second material 112 has a distribution within the ESD prevention layer 106 of about 75% population (e.g., the second material 112 occupies about 75% of a total volume of the ESD prevention layer 106) and has a size (e.g., thickness, height, width, diameter, etc. of conductive particles) that is less than about 500 nm, and has a greater conductivity than the first material 110.

In some embodiments, the first material has a conductivity that is less than about $1 \times 10^{-20}$ S/m at 20° C., and in some embodiments, the first material has a conductivity that is less than about $1 \times 10^{-23}$ S/m at 20° C. In some embodiments, the second material has a conductivity that is greater than about $1 \times 10^3$ S/m at 20° C., and in some embodiments, the second material has a conductivity that is greater than about $1 \times 10^5$ S/m at 20° C.

In some embodiments, the ESD prevention layer 106 has an overall volume resistivity that is between about $1 \times 10^4$ Ω-cm and about $1 \times 10^{11}$ Ω-cm, which is suitable for dissipation of electrostatic charges in the ESD prevention layer 106.

The ESD prevention layer 106 may include one or more materials in addition to the first material 110 and the second material 112. For example, as shown in FIG. 2, the ESD prevention layer 106 may include one or more additives 114, which may be, for example, any material which is added to the ESD prevention layer 106, and which alters one or more properties or characteristics of the ESD prevention layer 106. In some embodiments, the additive 114 may alter any of durability, stiffness, melting point, density, viscosity, coefficient of thermal expansion (CTE), thermal conductivity, chemical resistance, ultraviolet (UV) or extreme ultraviolet (EUV) resistance, resistance to high temperatures, resistance to laser pulses, resistance to plasmas, resistances to etchants, resistances to acids, resistance to bases, or any other properties or characteristics of the ESD prevention layer 106. The additive 114 includes a material that is different from the first material 110 and the second material 112 of the ESD prevention layer 106.

The type, concentration, material, or any other properties of the additive 114 included in the ESD prevention layer 106 may differ in various embodiments, depending, for example, on a type of semiconductor process that is implemented in an environment where the ESD prevention layer 106 is provided on the wafer handling structure, such as the wafer stage 102.

For example, in some embodiments, the additive 114 may be an anti-acid additive, which increases a resistance of the ESD prevention layer 106 to acids.

In some embodiments, the additive 114 may be an anti-base additive, which increases a resistance of the ESD prevention layer 106 to bases. In some embodiments, the first material 110 itself may have anti-additive or anti-base properties. For example, in some embodiments, the first material 110 may include one or more of Polyetheretherketone (PEEK), Polytetrafluoroethylene (PTFE), or polyimide (PI), which have chemical resistance properties, such as anti-acid and anti-base properties, which may be retained to high temperatures.

In some embodiments, the additive 114 may be an anti-EUV additive, which increases a resistance of the ESD prevention layer 106 to extreme ultraviolet light.

In various embodiments, the additive 114 may be or include any metallic or metallic oxide powder, polymeric powders, or microparticles such as microspheres.

In some embodiments, the additive 114 includes microspheres, which may be any generally spherical microparticles, and which may have a size (e.g., a diameter) less than about 1 mm. In some embodiments, the additive 114 includes microparticles that have a size less than about 1 μm.

In some embodiments, the additive 114 includes a powder, such as a powder including one or more of aluminum nitride (AlN), magnesium oxide (MgO), boron nitride (BN), diamond, or copper, which can be added to the ESD prevention layer 106 to increase thermal conductivity.

The additive 114 may be uniformly distributed throughout the ESD prevention layer 106 (e.g., the additive 114 may be evenly mixed with the first material 110 and the second material 112), and the ESD prevention layer 106 may be a homogenous mixture including the first material 110, the second material 112, and the additive 114. In other embodiments, the additive 114 is non-uniformly distributed in the ESD prevention layer 106. For example, in some embodiments, the additive 114 may be dispersed in the first material 110 with a concentration gradient, for example, with a concentration that increases or decreases along the thickness 111 of the ESD prevention layer 106. In some embodiments, the additive 114 may have a concentration that is highest near an exposed surface (e.g., an upper surface) of the ESD prevention layer 106, so that the ESD prevention layer 106 has a greatest amount of the additive property (e.g., anti-acid, anti-base, anti-EUV, etc.) in regions of the ESD prevention layer 106 that are exposed to the various process conditions (e.g., etchants, acids, bases, EUV light, etc.) encountered within an environment (e.g., a process chamber 120) in which the ESD prevention layer 106 is provided.

Figure 3A:
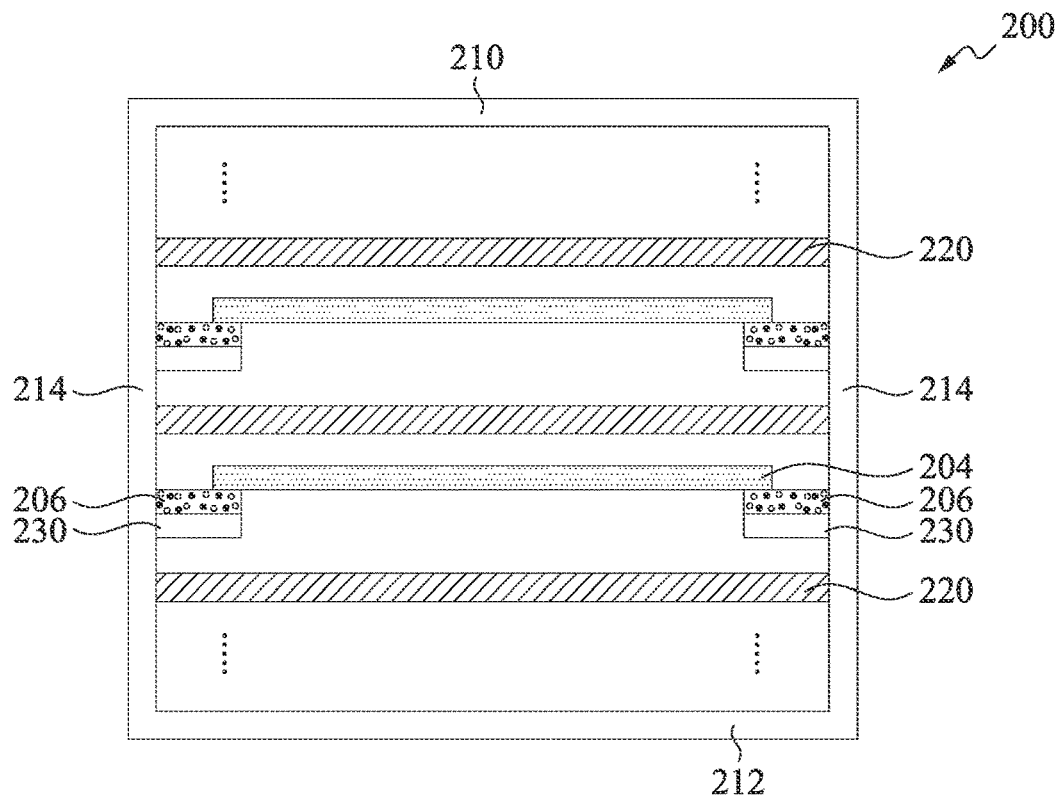
FIG. 3A is a front view illustrating a semiconductor wafer transport pod, in accordance with some embodiments.
Figure 3B:
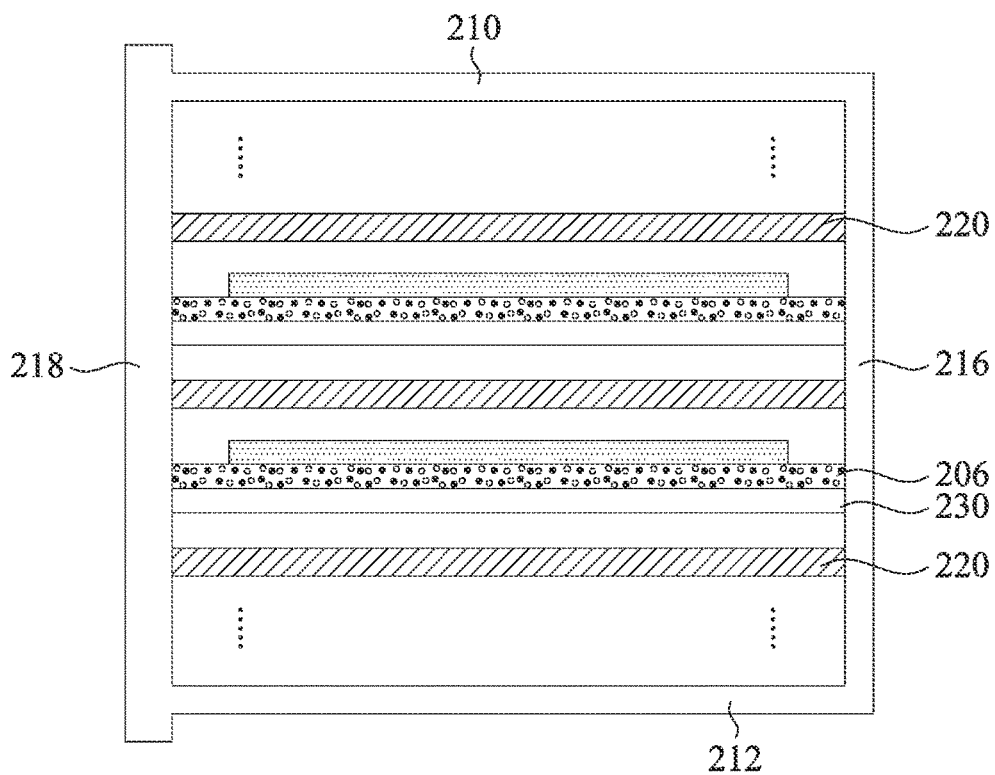
FIG. 3B is a side view illustrating the semiconductor wafer transport shown in FIG. 3A.

FIG. 3A is a front view illustrating a semiconductor wafer transport pod 200, and FIG. 3B is a side view of the wafer transport pod 200 of FIG. 3A in accordance with one or more embodiments of the present disclosure.

The wafer transport pod 200 may be any structure that carries one or more semiconductor wafers, including, for example, any wafer carrier or the like. In some embodiments, the wafer transport pod 200 may be a Front Opening Unified Pod (FOUP), which may be referred to herein as FOUP 200.

The FOUP 200 may be a hermetically-sealed container in which semiconductor wafers 204 may be carried, for example, during transport of the wafers 204 between processing tools in a semiconductor device manufacturing environment. The FOUP 200 holds the wafers 204 and protects the wafers 204 from contaminants (e.g., chemical contaminants, particulates, gases, etc.) during storage or transport of the wafers 204 in the FOUP 200.

The FOUP 200 includes a housing which is formed of an upper panel 210, a lower panel 212, side panels 214, a back panel 216, and a front panel 218. The front panel 218 may be movable with respect to the rest of the FOUP 200, for example, the front panel 218 may be a door which can be opened and shut, thereby allowing a plurality of wafers 204 to be placed within or removed from the FOUP 200. The front panel 218 may open and shut along any rotational or translational axis. For example, in some embodiments, the front panel 218 may open outwardly (e.g., by rotating forward with respect to the lower panel 212), or the front panel 218 may be opened by sliding up or down. In some embodiments, the front panel 218 may be opened by completely removing the front panel 218 from the FOUP 200.

The FOUP 200 includes a plurality of wafer support structures 230, each of which may be connected to one of the side panels 214. The wafer support structures 230 may be provided in the form of rails or slots which extend along the side panels 214 between the front panel 218 and the back panel 216. Corresponding pairs of the wafer support structures 230 are configured to support the semiconductor wafers 204. For example, a wafer support structure 230 on one of the side panels 214 may support one edge portion of a wafer 204, while an opposite wafer support structure 230 on an opposite side panel 214 may support an opposite edge portion of the wafer 204, and a center portion of the wafer 204 may be exposed in an opening between the corresponding pair of the wafer support structures 230.

The wafer support structures 230 of the FOUP 200 are another example of a wafer handling structure on which an ESD protection layer may be provided to protect against ESD events between a semiconductor wafer and another object. As previously described herein, a wafer handling structure may be any structure of a semiconductor manufacturing apparatus or tool which supports, secures, moves, or otherwise handles a semiconductor wafer during processing of the wafer. As shown in FIGS. 3A and 3B, an ESD prevention layer 206 may be provided on the wafer support structures 230 of the FOUP 200.

The ESD prevention layer 206 shown in FIGS. 3A and 3B may be substantially the same as, or identical to, the ESD prevention layer 106 previously described herein. For example, the ESD prevention layer 206 may include the first material 110, second material 112, and in some embodiments, the ESD prevention layer 206 may include one or more additives 114.

The semiconductor wafers 204 may be loaded into the FOUP 200, for example, by a load/unload port of a semiconductor processing apparatus. The ESD prevention layer 206 may dissipate static charge which may accumulate between the semiconductor wafers 204 and the FOUP 200 due to, for example, separating the wafers 204 from the wafer support structures 230.

While the ESD prevention layer 206 is shown in FIGS. 3A and 3B as being provided on the wafer support structures 230, in various embodiments, the ESD prevention layer 206 may be provided on any surfaces of the FOUP 200, including, for example, on inner surfaces of the front panel 218 or inner surfaces of the back panel 216.

The FOUP 200 may include any various additional features as may be desired in various embodiments or in various semiconductor manufacturing environments. For example, the FOUP 200 may include a plurality of partitions 220 which may form hermetically sealed partitions for each of the semiconductor wafers 204. For example, each wafer 204 may be positioned between a respective lower and upper partition 220, such that each individual wafer 204 is surrounded by a pair of partitions 220 which hermetically seal the wafer 204 within the FOUP 200. The partitions 220 may thus protect the semiconductor wafers 204 from contaminants that may transfer back to the surfaces of the wafers 204 in subsequent process steps as the wafers 204 are removed and returned to the FOUP 200. The FOUP 200 may additionally include one or more nozzles for the transfer of gas to or from the interior of the FOUP 200.

Figure 4:
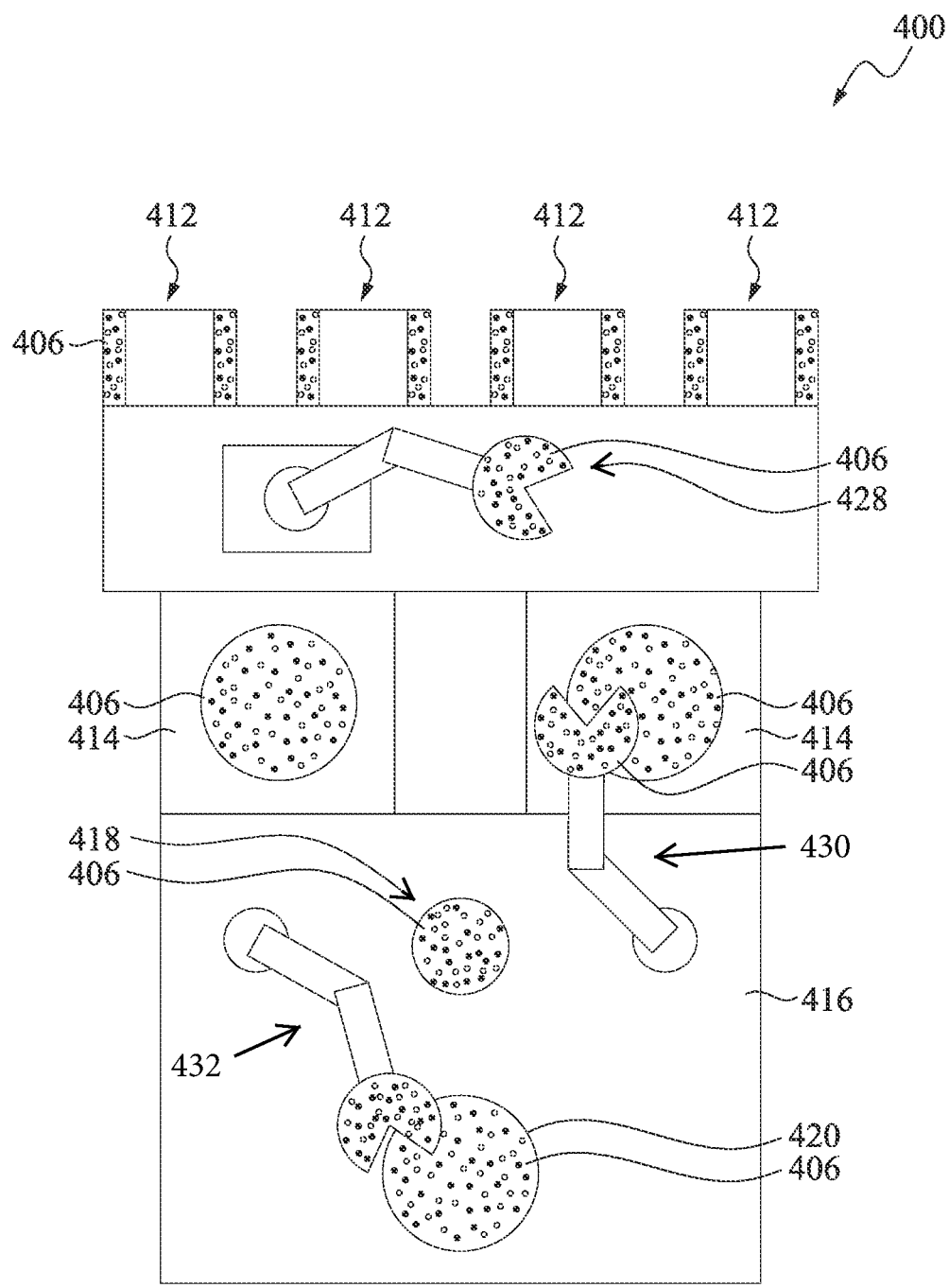
FIG. 4 is a top view schematically illustrating a semiconductor processing apparatus, in accordance with some embodiments.

FIG. 4 is a top view schematically illustrating a semiconductor processing apparatus 400, in accordance with one or more embodiments of the present disclosure. The semiconductor processing apparatus 400 shown in FIG. 4 is provided as an example to illustrate further wafer support structures which may be included within a semiconductor processing apparatus and which may be coated with an ESD prevention layer in accordance with various embodiments of the present disclosure.

The semiconductor processing apparatus 400 includes a plurality of load/unload ports 412 (which may be referred to herein as load ports). The load ports 412 may be configured to receive a plurality of semiconductor wafers. For example, in some embodiments, the load ports 412 are configured to receive a FOUP that carries a plurality of wafers, such as the FOUP 200 illustrated in FIG. 3.

The load ports 412 may include one or more wafer handling structures. For example, each of the load ports 412 may include one or more surfaces, components, or features which supports, secures, moves, or otherwise handles a semiconductor wafer during processing of the wafer by the semiconductor processing apparatus 400. More particularly, the load ports 412 may include structures that are configured to receive and support or otherwise handle a semiconductor wafer from the FOUP.

As shown in FIG. 4, an ESD prevention layer 406 may be provided on the wafer handling structures of one or more of the load ports 412. In the example shown in FIG. 4, an ESD prevention layer 406 may be provided in each of the load ports 412; however, embodiments of the present disclosure are not limited thereto. The ESD prevention layer 406 may be provided on any wafer handling structure within the load ports 412. As shown in FIG. 4, the ESD prevention layer 406 may be provided along sides of the load ports 412. For example, the load ports 412 may include side rails or slots, similar to the FOUP 200, which extend lengthwise from a front to a back of the load ports 412. Each of such side rails or slots may be coated with an ESD prevention layer 406. During use, the semiconductor wafers received by the load ports 412 will contact only the ESD prevention layer 406 which covers the wafer handling structures in the load ports 412.

The ESD prevention layer 406 shown in FIG. 4 may be substantially the same as, or identical to, the ESD prevention layer 106 or the ESD prevention layer 206 previously described herein. For example, the ESD prevention layer 406 may include the first material 110, second material 112, and in some embodiments, the ESD prevention layer 406 may include one or more additives 114.

The load ports 412 may be positioned adjacent to one or more load locks 414. As understood in the art, load locks 414 are configured to hold a plurality of wafers during fabrication. The load locks 414 are positioned adjacent a process chamber 416, which may be any process chamber for performing any known processes during processing of a semiconductor wafer. In the example shown in FIG. 4, the process chamber 416 includes a wafer orientor 418 and a wafer stage 420.

The semiconductor processing apparatus 400 may include a robotic arm 428 positioned adjacent to the load ports 412 for transferring semiconductor wafers between the load ports 412 and the load locks 414. The robotic arm 428 may be any robotic wafer handling structure as known in the art of semiconductor processing. The robotic arm 428 may be any robotic structure configured to transfer a semiconductor wafer from the load ports 412 to the load locks 414. The robotic arm 428 may have one or more joints or pivot points about which the arm may rotate. In some embodiments, the robotic arm 428 may be movable along a translational axis, for example, the robotic arm 428 may be capable of moving along any of an x-axis, a y-axis, or a z-axis. As shown in FIG. 4, one or more wafer handling surfaces of the robotic arm 428 may be coated by an ESD prevention layer 406, which may include any of the features of the ESD prevention layers previously described herein.

Similarly, the load locks 414 may include one or more wafer handling structures, which may be one or more surfaces configured to receive semiconductor wafers. One or more of the wafer handling structures of the load locks 414 may be coated by an ESD prevention layer 406, which may include any of the features of the ESD prevention layers previously described herein. Accordingly, the semiconductor wafers may contact the ESD prevention layer 406 when transferred by the robotic arm 428 to the load locks 414.

The process chamber 416 may be configured to perform any of a variety of known semiconductor processes, including, for example, physical vapor deposition, dry etching, wet etching, cleaning, polishing, thermal treatment, ion implantation, lithography, chemical vapor deposition, metrology, or any other process which may be performed in a semiconductor processing apparatus.

In the example shown in FIG. 4, the process chamber 416 includes a wafer orientor 418 and a wafer stage 420, each of which may be coated by an ESD prevention layer 406. That is, each of the orientor 418 and the wafer stage 420 may be examples of wafer handling structures included in a semiconductor processing apparatus which may be coated by an ESD prevention layer, which prevents or reduces ESD events from occurring between the semiconductor wafers and the orientor 418 or the wafer stage 420.

The orientor 418 may include any features of known orienteers 418 within the field of semiconductor processing. The orientor 418 may be configured to receive a semiconductor wafer and to orient the wafer in a desired orientation, for example, for processing of the wafer within the process chamber 416.

The wafer stage 420 may include any of the features of a wafer stage as known in the art of semiconductor processing. In some embodiments, the wafer stage 420 may be substantially the same as, or identical to, the wafer stage 102 shown in FIG. 1 and previously described herein.

The semiconductor processing apparatus 400 may further include robotic arms 430, 432 positioned inside the process chamber 416, and which may be configured to transfer wafers between load locks 414 and the process chamber 416 or to any other chambers which may be included in the apparatus 400. The robotic arms 430, 423 may be substantially the same as the robotic arm 428 previously described herein, and each of robotic arms 430, 432 may be coated with an ESD prevention layer 406.

Figure 5:
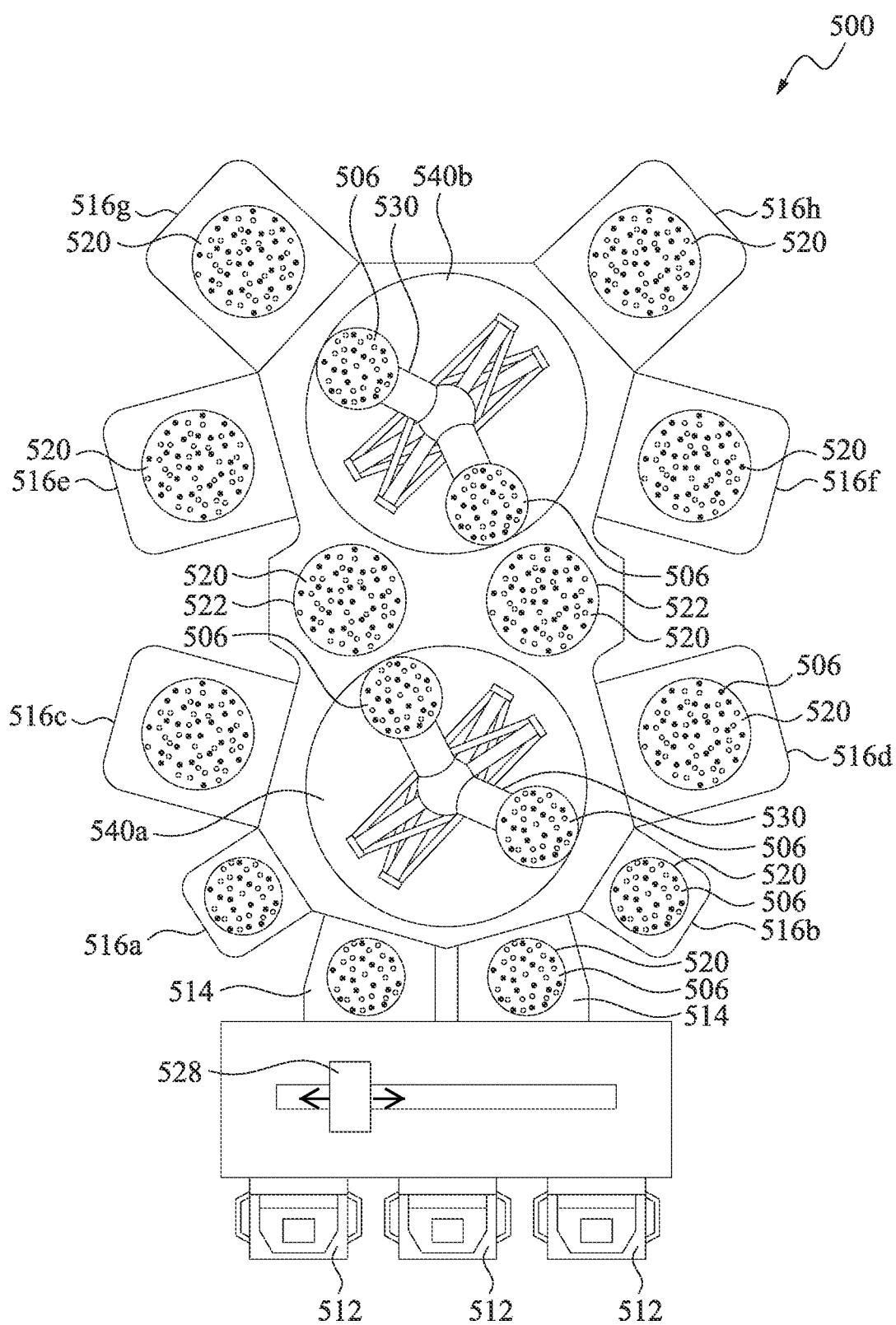
FIG. 5 is a top view schematically illustrating a semiconductor processing apparatus, in accordance with some embodiments.

FIG. 5 is a top view schematically illustrating a semiconductor processing apparatus 500, in accordance with one or more embodiments of the present disclosure. The semiconductor processing apparatus 500 may be, for example, a process tool configured to perform physical vapor deposition (PVD).

The apparatus 500 includes a plurality of load/unload ports 512, which may be substantially the same as, or identical to, the load ports 412 previously described herein with respect to FIG. 4. In some embodiments, the load ports 512 may include one or more wafer handling structures which supports, secures, moves, or otherwise handles a semiconductor wafer, and which may be coated by an ESD prevention layer.

The semiconductor processing apparatus 500 may include a robotic wafer handling structure 528 positioned adjacent to the load ports 512 for transferring semiconductor wafers between the load ports 512 and the load locks 514. The robotic wafer handling structure 528 may be any robotic wafer handling structure as known in the art of semiconductor processing. As shown in FIG. 5, the robotic wafer handling structure 528 may be movable along a translational axis, for example, the robotic wafer handling structure 528 may be capable of moving along any of an x-axis, as shown. In some embodiments, the robotic wafer handling structure 528 may be capable of moving along a y-axis, or a z-axis. In some embodiments, the robotic wafer handling structure 528 may be a robotic arm and may have one or more joints or pivot points about which the arm may rotate. One or more wafer handling surfaces of the robotic wafer handling structure 528 may be coated by an ESD prevention layer, which may include any of the features of the ESD prevention layers previously described herein.

The load locks 514 may be substantially similar to the load locks 414 previously described herein with respect to FIG. 4. The load locks 514 may include one or more wafer handling structures, which may be one or more surfaces configured to receive semiconductor wafers, for example, from a FOUP. The wafer handling structures (e.g., wafer stages 520) of the load locks 514 may be coated by an ESD prevention layer 506, which may include any of the features of the ESD prevention layers previously described herein. Accordingly, the semiconductor wafers may contact the ESD prevention layer 506 when transferred by the robotic wafer handling structure 528 to the load locks 514.

The semiconductor processing apparatus 500 may include one or more buffer chambers 540a, 540b, each of which houses at least one wafer handling robot 530. As shown in FIG. 5, the apparatus 400 may include two buffer chambers 540a, 540b, and each of the two buffer chambers may include two wafer handling robots 530. Each of the buffer chambers 540a, 540b is positioned adjacent to a respective plurality of process chambers 516a-516h. For example, the first buffer chamber 540a may be positioned adjacent to first, second, third, and fourth process chambers 516a-516d, while the second buffer chamber 540b may be positioned adjacent to fifth, sixth, seventh, and eighth process chambers 516e-516h. One or more transfer chambers 522 may be positioned between the first and second buffer chambers 540a, 540b, as shown in FIG. 5.

The wafer handling robots 530 may be any robotic wafer handling structure, such as a robotic arm, or any other robotic structure that is configured to handle a semiconductor wafer. As shown in FIG. 5, at least a portion of each of the wafer handling robots 530 may be coated by an ESD prevention layer 506, which may include any of the features of the ESD prevention layers previously described herein.

Each of the process chambers 516a-516h may be configured to perform any of a variety of known semiconductor processes, including, for example, physical vapor deposition, dry etching, wet etching, cleaning, polishing, thermal treatment, ion implantation, lithography, chemical vapor deposition, metrology, or any other process which may be performed in a semiconductor processing apparatus. To that end, each of the process chambers 516a-516h may include at least one wafer handling structure. For example, each of the process chambers 516a-516h may include a wafer stage 520, as shown in FIG. 5. The wafer stages 520 in each of the process chambers 516a-516h may include any of the features of a wafer stage as known in the art of semiconductor processing. In some embodiments, the wafer stages 520 may be substantially the same as, or identical to, the wafer stage 102 shown in FIG. 1 and previously described herein. One or more of the wafer stages 520 may be coated by an ESD prevention layer 506. The process chambers 516a-516h may include any additional components as may be included in known process chambers within the field of semiconductor processing. For example, in some embodiments, one or more of the process chambers 516a-516h may include a robotic arm or other robotic wafer handling structure, a platen, gas inlet and outlet ports, electrodes, heaters, or any other structures or features as may be known.

The transfer chambers 522 may similarly include wafer stages 520, which may be coated by an ESD prevention layer 506.

The semiconductor processing apparatus 500 may be utilized in a variety of different configurations, depending upon a semiconductor process that is desired to be carried out. In an example embodiment, the semiconductor processing apparatus 500 is an apparatus for physical vapor deposition (PVD). During processing of a semiconductor wafer, the wafer may proceed along various paths to different components of the apparatus 500.

In an example, a semiconductor wafer may be loaded into the apparatus 500 in a FOUP, and the wafer may contact an ESD prevention layer that is coated on a wafer handling structure of the FOUP, for example, as described previously herein with respect to FIGS. 3A and 3B. The wafer may be loaded into one of the load ports 512, from the FOUP, and the wafer may contact an ESD prevention layer that is coated on a wafer handling structure of the load ports 512. The wafer may then be received by the wafer handling structure 528 from one of the load ports 512, and the wafer handling structure 528 may transfer the semiconductor wafer to one of the load locks 514. The wafer may contact an ESD prevention layer coated on the wafer handling structure 528, and may be transferred to an ESD prevention layer that is coated on a wafer stage 520 of the load locks 514.

A wafer handling robot 530 in the first buffer chamber 540a may receive the wafer from the load lock 514 and transfer the wafer to a first process chamber 516a or a second process chamber 516b. Again, here the wafer handling robot 530 may contact the wafer with an ESD prevention layer that is coated on one or more surfaces of the wafer handling robot 530, and may transfer the wafer to a wafer stage 520 in the first or second process chamber 516a, 516b, such that the wafer is placed in contact with the ESD prevention layer on the wafer stage 520.

After processing of the wafer in the first or second process chamber 516a, 516b, the wafer may be returned to the first buffer chamber 540a by the wafer handling robot 530, and may be transferred by the wafer handling robot 530 of the first buffer chamber 540a to one of the third or fourth process chambers 516c, 516d. The wafer handling robot 530 may contact the wafer with the ESD prevention layer on one or more surfaces of the wafer handling robot 530, and may transfer the wafer to a wafer stage 520 in the third or fourth process chamber 516c, 516d, such that the wafer is placed in contact with the ESD prevention layer on the wafer stage 520.

Once the wafer is processed in the third or fourth process chamber 516c, 516d, the wafer may be returned to the first buffer chamber 540a by the wafer handling robot 530. From here, the wafer may be transferred to any of the first through fourth process chambers 516a-516d, for example, for further processing of the wafer. In some embodiments, the wafer may be transferred by the wafer handling robot 530 of the first buffer chamber 540a to one of the transfer chambers 522, so that the wafer can proceed to processing in one of the fifth through eighth process chambers 516e-516h.

In an example, the wafer handling robot 530 may contact the wafer with the ESD prevention layer on one or more surfaces of the wafer handling robot 530, and may transfer the wafer to a wafer stage 520 in the one of the transfer chambers 522, such that the wafer is placed in contact with the ESD prevention layer 506 on the wafer stage 520 in the transfer chambers 522.

A wafer handling robot 530 in the second buffer chamber 540b may receive the wafer from the transfer chamber 522 and transfer the wafer to a fifth process chamber 516e or a sixth process chamber 516f. As with the first buffer chamber 540a, the wafer handling robot 530 of the second buffer chamber 540b may contact the wafer with an ESD prevention layer that is coated on one or more surfaces of the wafer handling robot 530, and may transfer the wafer to a wafer stage 520 in the fifth or sixth process chamber 516e, 516f, so that the wafer is placed in contact with the ESD prevention layer on the wafer stage 520.

After processing of the wafer in the fifth or sixth process chamber 516e, 516f, the wafer may be returned to the second buffer chamber 540b by the wafer handling robot 530, and may be transferred by the wafer handling robot 530 of the second buffer chamber 540b to one of the seventh or eighth process chambers 516g, 516h. The wafer handling robot 530 may contact the wafer with the ESD prevention layer on one or more surfaces of the wafer handling robot 530, and may transfer the wafer to a wafer stage 520 in the seventh or eighth second process chamber 516g, 516h, such that the wafer is placed in contact with the ESD prevention layer on the wafer stage 520.

Once processing has been completed of the wafer in the seventh or eighth process chamber 516g, 516h, the wafer may return to the second buffer chamber 540b, to one of the transfer chambers 522, to the first buffer chamber 540a, to one of the load locks 514, to the wafer handling structure 528, and finally the wafer may be transferred by the wafer handling structure 528 back to one of the load ports 512 (e.g., back into a FOUP in the load port 512). During processing of the wafer in the semiconductor processing apparatus 500, the wafer contacts the ESD prevention layer 506 at least one time. For example, the wafer may contact the ESD prevention layer 506 on any of the load port 512, the wafer handling structure 528, the load locks 514, the first or second buffer chamber 540a, 540b, the transfer chambers 522, or any of the process chambers 516a-516h. In some embodiments, the semiconductor wafer contacts an ESD prevention layer 506 in each of these components of the apparatus 500, such that the semiconductor wafer is contacted by an ESD prevention layer 506 throughout the various processes that are implemented by the apparatus 500.

Figure 6:
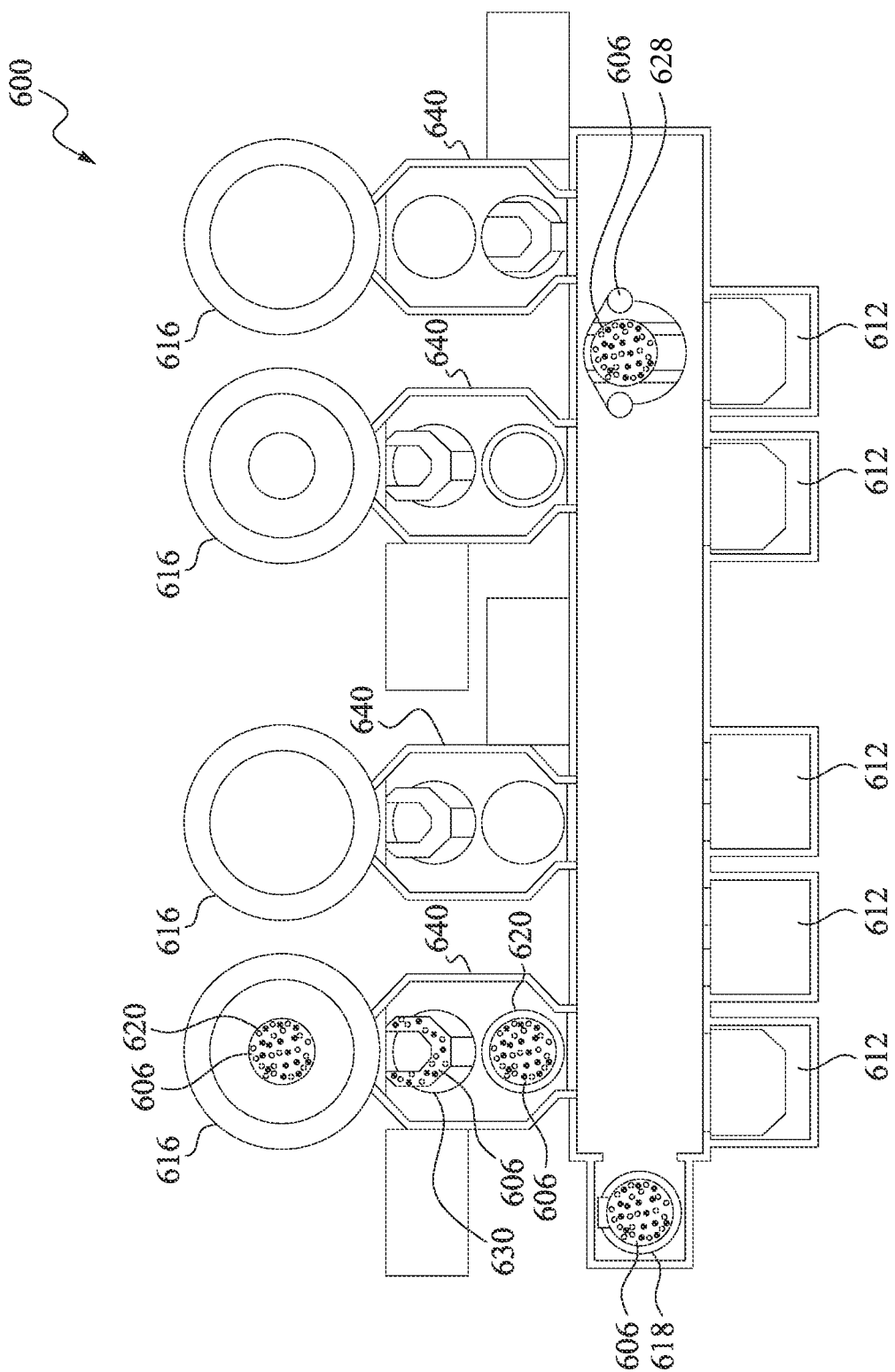
FIG. 6 is a top view schematically illustrating a semiconductor processing apparatus, in accordance with some embodiments.

FIG. 6 is a top view schematically illustrating a semiconductor processing apparatus 600, in accordance with one or more embodiments of the present disclosure. The semiconductor processing apparatus 600 may be, for example, a process tool configured to perform an etching process. In various embodiments, the semiconductor processing apparatus 600 may be configured to perform dry etching, polysilicon etching, oxide etching, silicon nitride (SiN) etching, metal etching, or any other etching process as may be known to those skilled in the art of semiconductor processing.

The apparatus 600 includes a plurality of load/unload ports 612, which may be substantially the same as, or identical to, the load ports 412 or 512 previously described herein. In some embodiments, the load ports 612 may include one or more wafer handling structures which supports, secures, moves, or otherwise handles a semiconductor wafer, and which may be coated by an ESD prevention layer.

The semiconductor processing apparatus 600 may include a robotic wafer handling structure 628 positioned adjacent to the load ports 612 for transferring semiconductor wafers between the load ports 612 and any of a plurality of buffer chambers 640. The robotic wafer handling structure 628 may be any robotic wafer handling structure as known in the art of semiconductor processing. As shown in FIG. 6, the robotic wafer handling structure 628 may be movable along a translational axis, for example, the robotic wafer handling structure 628 may be capable of moving along any of an x-axis, as shown. In some embodiments, the robotic wafer handling structure 628 may be capable of moving along a y-axis, or a z-axis. In some embodiments, the robotic wafer handling structure 628 may be a robotic arm and may have one or more joints or pivot points about which the arm may rotate. One or more wafer handling surfaces of the robotic wafer handling structure 628 may be coated by an ESD prevention layer 606, which may include any of the features of the ESD prevention layers previously described herein.

The apparatus 600 may include a wafer orientor 618, which may receive a wafer from the robotic wafer handling structure 628, and may orient the wafer in a desired orientation, for example, for processing of the wafer within the any of a plurality of process chambers 616. The orientor 618 may be coated with an ESD prevention layer 606, so that the wafer contacts the ESD prevention layer 606 when positioned on the orientor 618.

The buffer chambers 640 may be similar to the buffer chambers 540a, 540b previously described herein with respect to FIG. 5. In some embodiments, each of the buffer chambers 640 includes a wafer stage 620 and a wafer transfer structure 630. The wafer stages 620 of the buffer chambers 640 may be substantially similar to, or identical to, any of the wafer stages previously described herein.

The wafer stages 620 in each of the buffer chambers 640 may include any of the features of a wafer stage as known in the art of semiconductor processing. In some embodiments, the wafer stages 620 may be substantially the same as, or identical to, the wafer stage 102 shown in FIG. 1 and previously described herein. One or more of the wafer stages 620 may be coated by an ESD prevention layer 606.

Each of the buffer chambers 640 is positioned adjacent to one of a plurality of process chambers 616. The wafer transfer structures 630 in each of the buffer chambers 640 may be any robotic wafer handling structure, such as a robotic arm, or any other robotic structure that is configured to handle a semiconductor wafer. As shown in FIG. 6, at least a portion of each of the wafer transfer structures 630 may be coated by an ESD prevention layer 606, which may include any of the features of the ESD prevention layers previously described herein.

Each of the process chambers 616 may be configured to perform any of a variety of known semiconductor processes. Each of the process chambers 616 may include at least one wafer handling structure. For example, each of the process chambers 616 may include a wafer stage 620, as shown in FIG. 6. The wafer stages 620 in each of the process chambers 616 may include any of the features of a wafer stage as known in the art of semiconductor processing. In some embodiments, the wafer stages 620 may be substantially the same as, or identical to, the wafer stage 102 shown in FIG. 1 and previously described herein. One or more of the wafer stages 620 may be coated by an ESD prevention layer 606. The process chambers 616 may include any additional components as may be included in known process chambers within the field of semiconductor processing. For example, in some embodiments, one or more of the process chambers 616 may include a robotic arm or other robotic wafer handling structure, a platen, gas inlet and outlet ports, electrodes, heaters, or any other structures or features as may be known.

The semiconductor processing apparatus 600 may be utilized in a variety of different configurations, depending upon a semiconductor process that is desired to be carried out. In an example embodiment, the semiconductor processing apparatus 600 is an apparatus for performing an etching process, which may include, for example, dry etching, polysilicon etching, oxide etching, silicon nitride (SiN) etching, metal etching, or any other etching process as may be known to those skilled in the art of semiconductor processing.

During processing of a semiconductor wafer, the wafer may proceed along various paths to different components of the apparatus 600. In an example, a semiconductor wafer may be loaded into the apparatus 600 in a FOUP, and the wafer may contact an ESD prevention layer that is coated on a wafer handling structure of the FOUP, for example, as described previously herein with respect to FIGS. 3A and 3B. The wafer may be loaded into one of the load ports 612, from the FOUP, and the wafer may contact an ESD prevention layer that is coated on a wafer handling structure of the load ports 612. The wafer may then be received by the robotic wafer handling structure 628 from one of the load ports 612, and the robotic wafer handling structure 628 may transfer the semiconductor wafer to the orientor 618. The wafer may contact an ESD prevention layer 606 coated on the wafer handling structure 628, and may be transferred to an ESD prevention layer 606 that is coated on the orientor 618.

The orientor 618 may orient the wafer into a desired orientation for processing, for example, by rotating the wafer into a desired orientation. Once the wafer is properly oriented, the robotic wafer handling structure 628 may receive the wafer from the orientor 618 and transfer the wafer to one of the plurality of buffer chambers 640. For example, the robotic wafer handling structure 628 may transfer the wafer to a wafer stage 620 in one of the buffer chambers 640, and may position the wafer on an ESD prevention layer 606 coated on the wafer stage 620 so that the wafer contacts the ESD prevention layer 606 of the wafer stage 620.

The wafer transfer structure 630 in the buffer chamber 640 may receive the wafer from the wafer stage 620, and may transfer the wafer to one of the process chambers 616. The wafer transfer structure 630 (which may be, for example, a robotic arm or the like) may contact the wafer with an ESD prevention layer 606 that is coated on one or more surfaces of the wafer transfer structure 630, and may transfer the wafer to a wafer stage 620 in the process chamber 616, such that the wafer is placed in contact with the ESD prevention layer 606 on the wafer stage 620 in the process chamber 616.

After processing of the wafer in the process chamber 616, the wafer may be returned to the adjacent buffer chamber 640 by the wafer transfer structure 630, and may be transferred by the wafer transfer structure 630 of the buffer chamber 640 to the wafer stage 620 within the buffer chamber 640. The robotic wafer handling structure 628 may then receive the wafer from the wafer stage 620 within the buffer chamber 640, and may transfer the wafer to one of the other buffer chambers 640 for further processing in any of the plurality of process chambers 616, or the robotic wafer handling structure 628 may return the wafer to one of the load ports 612 (e.g., back into a FOUP in one of the load ports 612).

During processing of the wafer in the semiconductor processing apparatus 600, the wafer contacts the ESD prevention layer 606 at least one time. For example, the wafer may contact the ESD prevention layer 606 on any of the load ports 612, the robotic wafer handling structure 628, the orientor 618, the wafer stages 620 in any of the buffer chambers 640, the wafer transfer structures 630 in any of the buffer chambers 640, or a wafer stage 620 in any of the process chambers 616. In some embodiments, the semiconductor wafers contacts an ESD prevention layer 606 in each of these components of the apparatus 600, such that the semiconductor wafers are contacted by an ESD prevention layer 606 throughout the various processes that are implemented by the apparatus 600.

Figure 7:
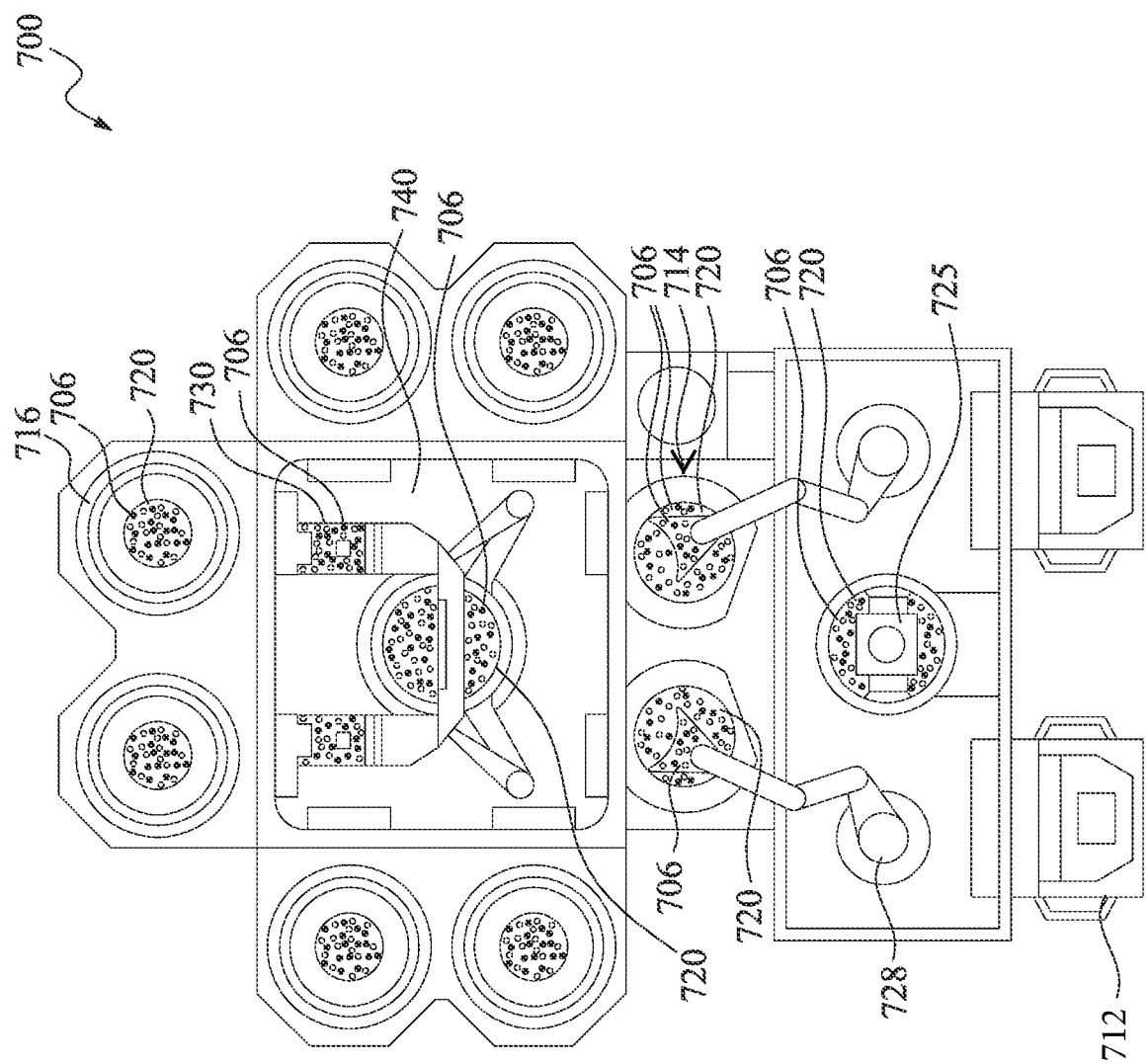
FIG. 7 is a top view schematically illustrating a semiconductor processing apparatus, in accordance with some embodiments.

FIG. 7 is a top view schematically illustrating a semiconductor processing apparatus 700, in accordance with one or more embodiments of the present disclosure. The semiconductor processing apparatus 700 may be, for example, a process tool configured to perform a chemical vapor deposition (CVD) process. In various embodiments, the semiconductor processing apparatus 700 may be configured to perform any CVD process, including, for example, processes for deposition of silicon nitrides ($Si_xN_y$), silicon oxides ($Si_xO_y$), nitrogen-free anti-reflective coating (NFARC) layers, hard black diamond (HBD), silicon carbide (SiC), undoped silicate glass (USG), phosphor-silicate glass (PSG), or any other deposition process as may be known to those skilled in the art of semiconductor processing.

The apparatus 700 includes a plurality of load/unload ports 712, which may be substantially the same as, or identical to, any of the load ports previously described herein. In some embodiments, the load ports 712 may include one or more wafer handling structures which supports, secures, moves, or otherwise handles a semiconductor wafer, and which may be coated by an ESD prevention layer.

The semiconductor processing apparatus 700 may include one or more robotic arms 728 positioned adjacent to the load ports 712 for transferring semiconductor wafers between the load ports 712 and a load lock 714. The robotic arms 728 may be any robotic wafer handling structures as known in the art of semiconductor processing. As shown in FIG. 7, the apparatus 700 may include two robotic arms 728, each of which may be any robotic structure configured to transfer a semiconductor wafer from the load ports 712 to the load lock 714. The robotic arms 728 may have one or more joints or pivot points about which the arm may rotate. In some embodiments, the robotic arms 728 may be movable along a translational axis, for example, the robotic arm 728 may be capable of moving along any of an x-axis, a y-axis, or a z-axis. As shown in FIG. 7, one or more wafer handling surfaces of the robotic arms 728 may be coated by an ESD prevention layer 706, which may include any of the features of the ESD prevention layers previously described herein.

A wafer stage 720 may be positioned adjacent to the robotic arms 728 and may be positioned between the load ports 712 and the load lock 714. A metrology device 725 is positioned over or adjacent the wafer stage 720. The metrology device 725 may be any device capable of measuring one or more properties of a wafer, including, for example, any optical imaging equipment, ellipsometer, interferometer, profilometer, magnetometer, reflectometer, scanning electron microscope (SEM), transmission electron microscope (TEM), defect scanner, or the like. In various embodiments, the metrology device 725 may be configured to measure any property of a wafer, including, for example, a thickness, uniformity, refractive index, overlay, defects, or any other properties of one or more layers deposited or formed on a wafer.

One or more wafer handling surfaces of the wafer stage 720 or the metrology device 725 may be coated by an ESD prevention layer 706, which may include any of the features of the ESD prevention layers previously described herein.

Similarly, the load lock 714 may include one or more wafer handling structures, which may be wafer stages 720 that are configured to receive semiconductor wafers. One or more of the wafer stages 720 of the load lock 714 may be coated by an ESD prevention layer 706, which may include any of the features of the ESD prevention layers previously described herein. Accordingly, the semiconductor wafers may contact the ESD prevention layer 706 of the wafer stages 720 in the load lock 714 when transferred by the robotic arm 728 to the load lock 714.

The apparatus 700 may further include a buffer chamber 740, which may be similar to or the same as any of the buffer chambers previously described herein. In some embodiments, the buffer chamber 740 includes a wafer stage 720 and one or more robotic arms 730. For example, as shown in FIG. 7, the buffer chamber 740 may include two robotic arms 730. The wafer stage 720 of the buffer chamber 740 may be substantially similar to, or identical to, any of the wafer stages previously described herein. Similarly, the robotic arms 730 of the buffer chamber 740 may be substantially the same as any of the robotic arms or robotic wafer handling structures previously described herein. The wafer stage 720 and the robotic arms 730 of the buffer chamber 740 may be coated by an ESD prevention layer 706, which may include any of the features of the ESD prevention layers previously described herein.

The buffer chamber 740 is positioned adjacent to a plurality of process chambers 716. Each of the process chambers 716 may be configured to perform any of a variety of known semiconductor processes. Each of the process chambers 716 may include at least one wafer handling structure. For example, each of the process chambers 716 may include a wafer stage 720, as shown in FIG. 7. The wafer stages 720 in each of the process chambers 716 may include any of the features of a wafer stage as known in the art of semiconductor processing. In some embodiments, the wafer stages 720 may be substantially the same as, or identical to, the wafer stage 102 shown in FIG. 1 and previously described herein. One or more of the wafer stages 720 may be coated by an ESD prevention layer 706. The process chambers 716 may include any additional components as may be included in known process chambers within the field of semiconductor processing. For example, in some embodiments, one or more of the process chambers 716 may include a robotic arm or other robotic wafer handling structure, a platen, gas inlet and outlet ports, electrodes, heaters, or any other structures or features as may be known.

The semiconductor processing apparatus 700 may be utilized in a variety of different configurations, depending upon a semiconductor process that is desired to be carried out. In an example embodiment, the semiconductor processing apparatus 700 is an apparatus for performing chemical vapor deposition (CVD) process.

During processing of a semiconductor wafer, the wafer may proceed along various paths to different components of the apparatus 700. In an example, a semiconductor wafer may be loaded into the apparatus 700 in a FOUP, and the wafer may contact an ESD prevention layer that is coated on a wafer handling structure of the FOUP, for example, as described previously herein with respect to FIGS. 3A and 3B. The wafer may be loaded into one of the load ports 712, from the FOUP, and the wafer may contact an ESD prevention layer that is coated on a wafer handling structure of the load ports 712. The wafer may then be received by one of the robotic arms 728 from one of the load ports 712, and the robotic arm 728 may transfer the semiconductor wafer to the load lock 714. The wafer may contact an ESD prevention layer 706 coated on the robotic arm 728, and may be transferred to an ESD prevention layer 706 that is coated on the wafer stage 720 in the load lock 714.

One of the robotic arms 730 in the buffer chamber 740 may receive the wafer from the wafer stage 720 in the load lock 714, and may transfer the wafer to one of the process chambers 716. The robotic arm 730 may contact the wafer with an ESD prevention layer 706 that is coated on one or more surfaces of the robotic arm 730, and may transfer the wafer to a wafer stage 720 in the process chamber 716, such that the wafer is placed in contact with the ESD prevention layer 706 on the wafer stage 720 in the process chamber 716. In some embodiments, the robotic arm 730 in the buffer chamber 740 may first transfer the wafer to the wafer stage 720 within the buffer chamber 740, and then may transfer the wafer from the wafer stage 720 in the buffer chamber 740 to the wafer stage 720 in one of the process chambers 716.

After processing of the wafer in the process chamber 716, the wafer may be returned to the buffer chamber 740 by one of the robotic arms 730, and may be transferred by one of the robotic arms 730 to the wafer stage 720 within the buffer chamber 740. The robotic arms 730 may transfer the wafer from the wafer stage 720 within the buffer chamber 740 to one or more other process chambers 716, for example, for further processing of the wafer. Once the processing of the wafer has been completed in the process chambers 716, the wafer may be returned to the buffer chamber 740, and the robotic arms 730 may return the wafer to load lock 714. For example, one of the robotic arms 730 in the buffer chamber 740 may transfer the processed wafer to one of the wafer stages 720 within the load lock 714. One of the robotic arms 728 may then receive the processed wafer and transfer the processed wafer to the wafer stage 720 positioned adjacent to or below the metrology device 725, and the metrology device 725 may measure one or more parameters of the processed wafer, including, for example, a thickness, uniformity, refractive index, overlay, defects, or any other properties of one or more layers deposited or formed on the wafer. One of the robotic arms 728 may then transfer the wafer to one of the load ports 712 (e.g., back into a FOUP in one of the load ports 712).

During processing of the wafer in the semiconductor processing apparatus 700, the wafer contacts the ESD prevention layer 706 at least one time. For example, the wafer may contact the ESD prevention layer 706 on any of the load ports 712, the robotic arms 728, the metrology device 725, the wafer stage 720 adjacent to the metrology device 725, the wafer stages 720 in the load lock 714, the wafer stage 720 in the buffer chamber 740, the robotic arms 730 in the buffer chamber 740, or a wafer stage 720 in any of the process chambers 716. In some embodiments, the semiconductor wafers contacts an ESD prevention layer 706 in each of these components of the apparatus 700, such that the semiconductor wafers are contacted by an ESD prevention layer 706 throughout the various processes that are implemented by the apparatus 700.

Figure 8:
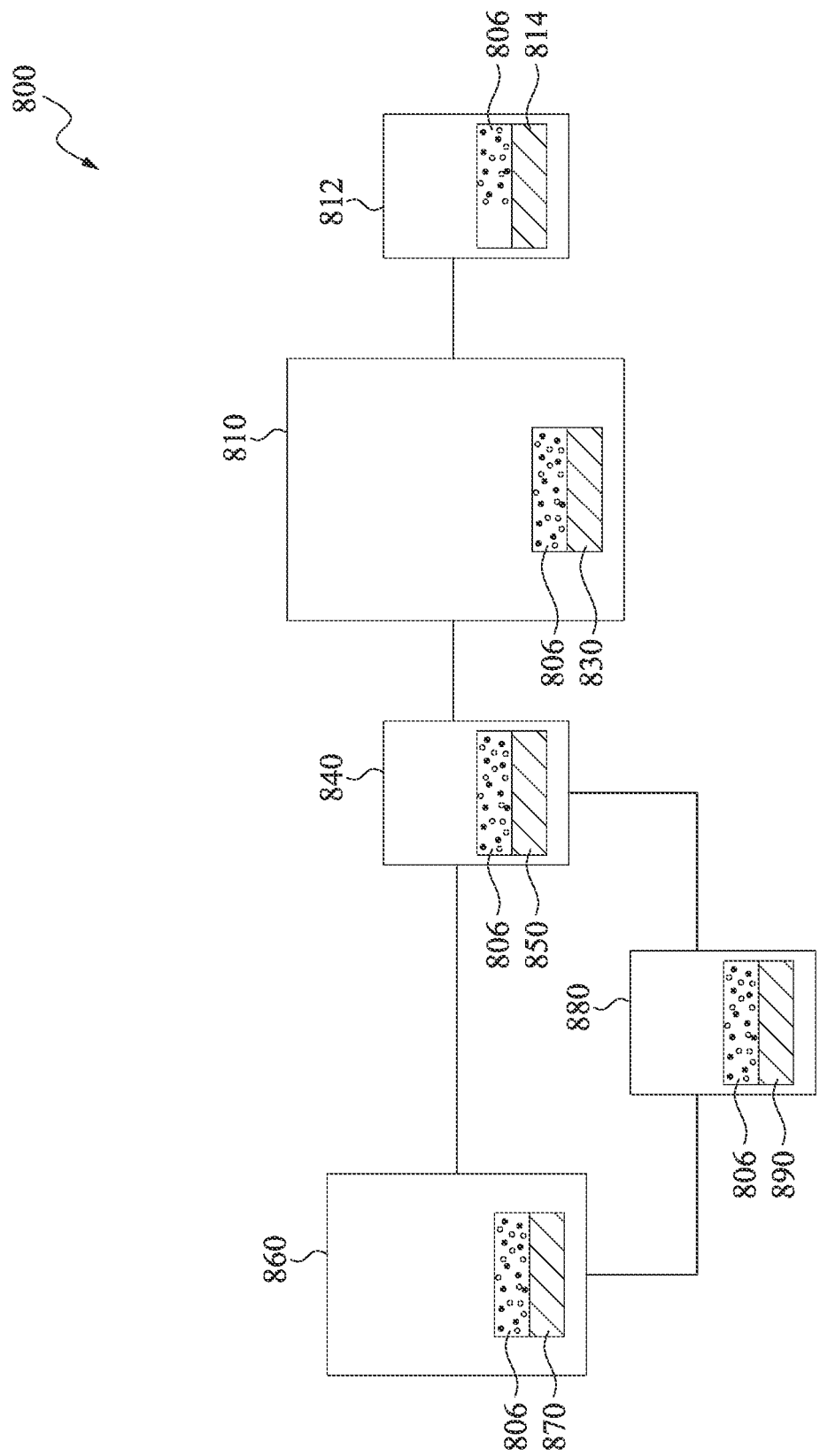
FIG. 8 is block diagram schematically illustrating a semiconductor processing apparatus, in accordance with some embodiments.

FIG. 8 is block diagram schematically illustrating a semiconductor processing apparatus 800, in accordance with one or more embodiments of the present disclosure. The semiconductor processing apparatus 800 may be, for example, a process tool configured to perform an extreme ultraviolet (EUV) lithography process. In various embodiments, the semiconductor processing apparatus 800 may be configured to perform any lithography process, including, for example, any lithography process as may be known to those skilled in the art of semiconductor processing. The apparatus 800 may include various processing tools and metrology tools coupled together and configured for performing various lithography processes including coating, alignment, exposure, baking, developing, or any lithography patterning processes.

The apparatus 800 includes a wafer load port 812, which may be substantially the same as, or identical to, any of the load ports previously described herein. In some embodiments, the load port 812 may include one or more wafer handling structures 814 which supports, secures, moves, or otherwise handles a semiconductor wafer, and which may be coated by an ESD prevention layer 806. In some embodiments, the wafer load port 812 is configured to receive semiconductor wafers carried in a FOUP.

The apparatus 800 may include a track 810 for photoresist coating. The track 810 may be any processing tool that integrates photoresist processing (e.g., photoresist coating) into one tool. The photoresist processing may include, for example, coating, baking, and development according to some embodiments. The track 810 may include any components which may be known to those skilled in the art of semiconductor processing, including, for example, photoresist coating components, development components, and baking components. In some embodiments, any of a variety of wafer handling structures 830 may be included in the track 810 and may be coated with an ESD prevention layer 806. The wafer handling structures 830 included in the track 810 may be any structures which supports, secures, moves, or otherwise handles a semiconductor wafer, and may be, for example, any robotic wafer handling structure, wafer stage, or other wafer handling structure previously described herein.

In various embodiments, one or more wafer handling structures, such as a robotic wafer handling structure, may be positioned between the load port 812 and the track 810, and may be configured to transfer semiconductor wafers from the load port 812 to the track 810. Such wafer handling structures may be coated by an ESD prevention layer as described herein.

The track 810 may be positioned adjacent to, or otherwise coupled to, a transfer unit 840, which transfers the semiconductor wafers to an exposure apparatus 860. The transfer unit 840 may include any features or functionalities which may be known to those skilled in the art of semiconductor processing. In some embodiments, the transfer unit 840 may include one or more wafer handling structures 850 which may be coated with an ESD prevention layer 806. The wafer handling structures 850 included in the transfer unit 840 may be any structures which support, secure, move, or otherwise handle a semiconductor wafer, and may be, for example, any robotic wafer handling structure, wafer stage, or other wafer handling structure previously described herein.

The exposure apparatus 860 may include any features or functionalities which may be known to those skilled in the art of semiconductor processing. In some embodiments, the exposure apparatus 860 may include one or more wafer handling structures 870 which may be coated with an ESD prevention layer 806. The wafer handling structures 870 included in the exposure apparatus 860 may be any structures which support, secure, move, or otherwise handle a semiconductor wafer, and may be, for example, any robotic wafer handling structure, wafer stage, or other wafer handling structure previously described herein.

In some embodiments, the semiconductor processing apparatus 800 includes a mask pod load/unload port 880 (which may be referred to herein as mask pod load port 880). The mask pod load port 880 may be similar in some respects to the load ports previously described herein; however, instead of receiving one or more semiconductor wafers, the mask pod load port 880 is configured to receive one or more masks (e.g., photomasks or reticles) which may be provided, for example, within a mask pod that is configured to be inserted into the mask pod load port 880. The mask pod load port 880 may include one or more wafer handling structures 890 which may be coated with an ESD prevention layer 806. The wafer handling structures 890 included in the mask pod load port 880 may be any structures which support, secure, move, or otherwise handle a semiconductor wafer, and may be, for example, any robotic wafer handling structure, wafer stage, or other wafer handling structure previously described herein. In some embodiments, the wafer handling structures 890 included in the mask pod load port 880 are surfaces within the mask pod load port 880 that are configured to receive a mask, and which are coated with an ESD prevention layer 806. The mask pod load port 880 may be positioned between, and coupled to, the transfer unit 840 and the exposure apparatus 860.

During use, a mask may be transferred from the mask pod load port 880 to the exposure apparatus 860. The mask may be utilized in the exposure apparatus 860 to pattern one or more layers on a semiconductor wafer received, for example, through the transfer unit 840.

During processing of a semiconductor wafer by the semiconductor processing apparatus 800, the wafer may proceed along various paths to different components of the apparatus 800. In an example, a semiconductor wafer may be loaded into the apparatus 800 in a FOUP, and the wafer may contact an ESD prevention layer that is coated on a wafer handling structure of the FOUP, for example, as described previously herein with respect to FIGS. 3A and 3B. The wafer may be loaded into the load port 812, from the FOUP, and the wafer may contact an ESD prevention layer 806 that is coated on a wafer handling structure 814 of the load port 812. The wafer may then be transferred (e.g., by one or more robotic wafer handling structures) from the load port 812 to the track 810 for photoresist coating. The wafer may contact an ESD prevention layer 806 coated on one or more wafer handling structures 830 in the track 810.

After processing of the wafer in the track 810, the wafer may be transferred to the transfer unit 840 (e.g., by one or more robotic wafer handling structures), and the wafer may contact an ESD prevention layer 806 on one or more wafer handling structures 850 within the transfer unit 840. The transfer unit 840 may transfer the wafer to the exposure apparatus 860. For example, the transfer unit 840 may transfer the wafer to one or more wafer handling structures 870, such as a wafer stage or robotic wafer handling structure within the exposure apparatus 860 that is coated with an ESD prevention layer 806.

A mask may be received by the mask pod load port 880 and may contact an ESD prevention layer 806 coated on one or more wafer handling structures 890 of the mask pod load port 880. The mask may be transferred from the mask pod load port 880 to the exposure apparatus 860. The mask may be utilized in the exposure apparatus 860 to pattern one or more layers on the semiconductor wafer in the exposure apparatus 860 that is received, for example, through the transfer unit 840.

After processing of the wafer in the exposure apparatus 860, the wafer may be returned to the transfer unit 840, the track 810, and to the load port 812.

During processing of the wafer in the semiconductor processing apparatus 800, the wafer contacts at least one ESD prevention layer 806 at least one time. For example, the wafer may contact an ESD prevention layer 806 on any of a wafer handling structure 814 in the load port 812, a wafer handling structure 830 in the track 810, a wafer handling structure 850 in the transfer unit 840, or a wafer handling structure 870 in the exposure apparatus 860. In some embodiments, the semiconductor wafers contact an ESD prevention layer 806 in each of these components of the apparatus 800, such that the semiconductor wafers are contacted by an ESD prevention layer 806 throughout the various processes that are implemented by the apparatus 800.

Moreover, the mask may contact at least one ESD prevention layer 806 during processing of the mask in the semiconductor processing apparatus 800. For example, the mask may contact an ESD prevention layer 806 on a wafer handling structure 890 in the mask load port 880, or an ESD prevention layer 806 on one or more mask handling structures within the exposure apparatus 860.

Although not illustrated, in any of the various embodiments of semiconductor processing apparatuses provided herein, additional components may be included, including, for example, at least one processor, non-transitory computer-readable storage, communication module, I/O devices, an optional display, etc., all of which may be interconnected via a system bus. Software instructions executable by the processor for implementing the methodologies described herein may be stored in the system storage or some other computer-readable medium, or uploaded into such memories from another storage media via wired/wireless methodologies.

Figure 9:
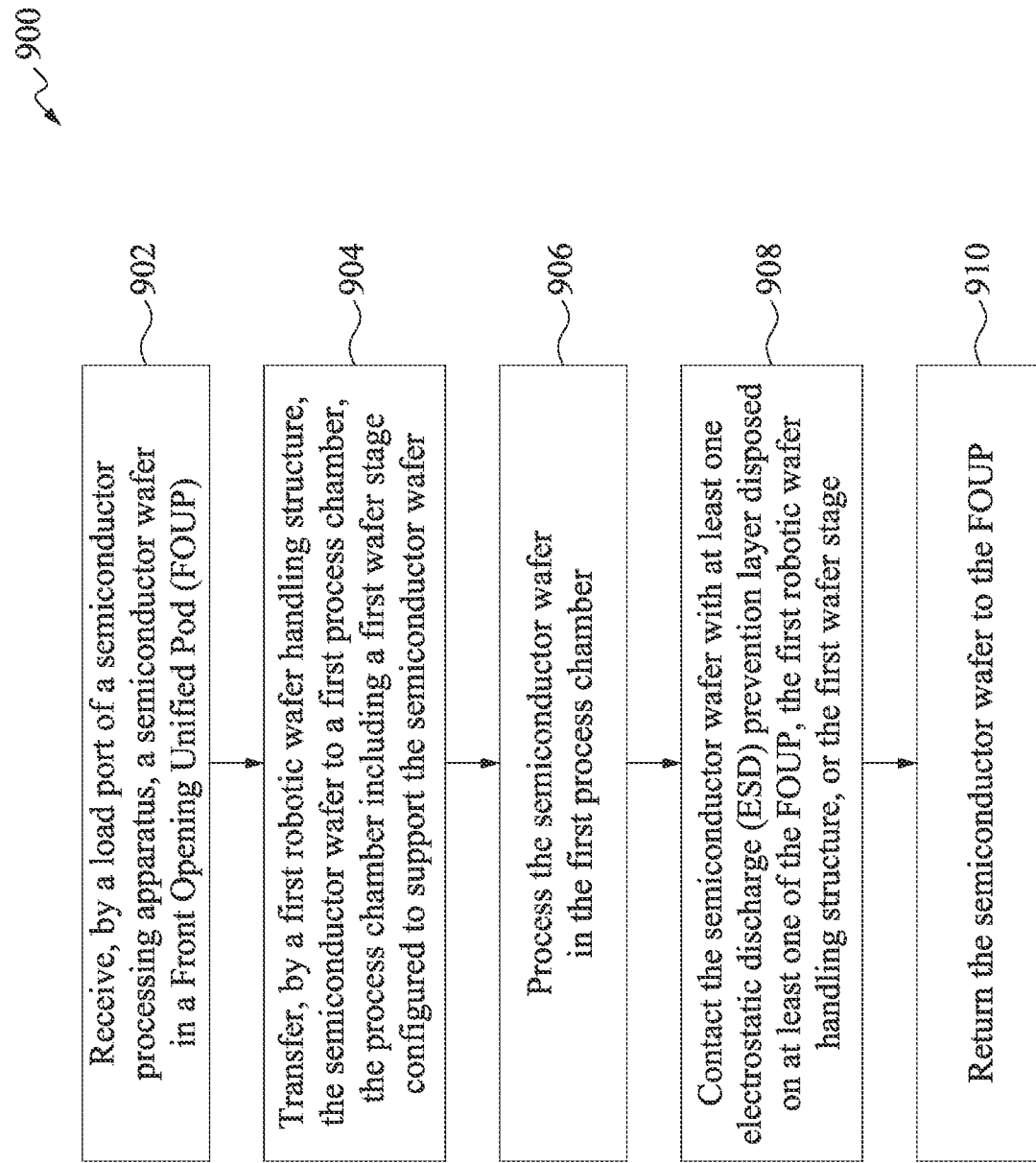
FIG. 9 is a flowchart illustrating a semiconductor processing method, in accordance with some embodiments.

FIG. 9 is a flowchart 900 illustrating a semiconductor processing method, in accordance with one or more embodiments. The method may be implemented by any semiconductor processing apparatus, including, for example, by one or more of the semiconductor processing apparatuses 400, 500, 600, 700, or 800 described herein with respect to FIGS. 4 through 8.

At 902, a load port of the semiconductor processing apparatus receives a semiconductor wafer in a Front Opening Unified Pod (FOUP). The load port may be, for example, any load port of any of the semiconductor processing apparatuses described herein.

At 904, a first robotic wafer handling structure transfers the semiconductor wafer to a first process chamber of the semiconductor processing apparatus. The first robotic wafer handling structure may be, for example, any robotic wafer handling structure as described herein, including, for example, a robotic arm or the like. The robotic wafer handling structure may be movable along a translational axis, such as an x-axis, a y-axis, or a z-axis, and in some embodiments, the robotic wafer handling structure may be a robotic arm and may have one or more joints or pivot points about which the arm may rotate.

At 906, the semiconductor wafer is processed in the first process chamber. The first process chamber includes a first wafer stage configured to support the semiconductor wafer. For example, the first wafer stage may support the wafer during processing in the first process chamber. The first wafer stage may be, for example, any of the wafer stages described herein.

At 908, the semiconductor wafer contacts with at least one electrostatic discharge (ESD) prevention layer that is disposed on at least one of the FOUP, the first robotic wafer handling structure, or the first wafer stage. The at least one ESD prevention layer includes a first material 110 and a second material 112, and the second material 112 has an electrical conductivity that is greater than an electrical conductivity of the first material 110. The ESD prevention layer may include any of the features of ESD prevention layers as described herein.

At 910, the semiconductor wafer is returned to the FOUP.

Embodiments of the present disclosure provide several advantages. For example, in some embodiments, ESD between a semiconductor wafer and one or more components within a semiconductor processing apparatus is prevented or reduced due to the presence of an ESD protection layer that contacts the wafer at least one time during the processing of the wafer. Reducing or eliminating ESD during manufacturing of semiconductor devices can result in increased production yields, quality, reliability, and profitability, since defects due to ESD damage can be reduced.

According to one embodiment, a semiconductor processing apparatus includes a wafer handling structure and an electrostatic discharge (ESD) prevention layer. The wafer handling structure is configured to support a semiconductor wafer during processing of the semiconductor wafer in the semiconductor processing apparatus. The ESD prevention layer includes a first material and a second material, and the second material has an electrical conductivity that is greater than an electrical conductivity of the first material.

According to another embodiment, a semiconductor processing apparatus, includes a load/unload port configured to receive a Front Opening Unified Pod (FOUP) carrying a semiconductor wafer. A first robotic wafer handling structure is configured to transport the semiconductor wafer within the semiconductor processing apparatus. A process chamber is included that has a first wafer stage configured to support the wafer. The semiconductor processing apparatus further includes at least one electrostatic discharge (ESD) prevention layer which includes a first material and a second material. The second material has an electrical conductivity that is greater than an electrical conductivity of the first material. The at least one ESD prevention layer is provided on at least one of the FOUP, the load/unload port, the first robotic wafer handling structure, or the first wafer stage.

According to yet another embodiment, a method is provided that includes receiving, by a load port of a semiconductor processing apparatus, a semiconductor wafer in a Front Opening Unified Pod (FOUP). The semiconductor wafer is transferred by a first robotic wafer handling structure to a first process chamber of the semiconductor processing apparatus. The semiconductor wafer is processed in the first process chamber, which includes a first wafer stage configured to support the semiconductor wafer. The semiconductor wafer contacts at least one electrostatic discharge (ESD) prevention layer which includes a first material and a second material, and the second material has an electrical conductivity that is greater than an electrical conductivity of the first material. The at least one ESD prevention layer is disposed on at least one of the FOUP, the first robotic wafer handling structure, or the first wafer stage. The method further includes returning the semiconductor wafer to the FOUP.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor processing apparatus, comprising:
a wafer handling structure, the wafer handling structure configured to support a semiconductor wafer during processing of the semiconductor wafer in the semiconductor processing apparatus; and
an electrostatic discharge (ESD) prevention layer on the wafer handling structure, the ESD prevention layer including a first material and a second material, the second material having an electrical conductivity that is greater than an electrical conductivity of the first material,
wherein the ESD prevention layer includes a homogeneous mixture of the first material and the second material, and wherein the ESD prevention layer further includes at least one additive material, the at least one additive material including at least one of an anti-acid material, an anti-base material, or an anti-extreme ultraviolet (EUV) material.

2. The semiconductor processing apparatus of claim 1 wherein the first material is at least one of a polymer or a resin material.

3. The semiconductor processing apparatus of claim 1 wherein the first material has a thickness of at least 10 μm.

4. The semiconductor processing apparatus of claim 1 wherein the second material includes conductive particles that have a particle size that is less than about 1 μm.

5. The semiconductor processing apparatus of claim 1 wherein the first material has a thickness of at least 1 μm.

6. The semiconductor processing apparatus of claim 1 wherein the second material includes conductive particles, and the particle size of the conductive particles of the second material is less than 500 nm.

7. The semiconductor processing apparatus of claim 1 wherein the second material includes conductive particles having a size that is less than a thickness of the first material.

8. The semiconductor processing apparatus of claim 1 wherein the first material occupies a volume between about 60% and about 80% of a total volume of the ESD prevention layer.

9. The semiconductor processing apparatus of claim 1 wherein the wafer handling structure has a surface having an area that is greater than an area of a surface of the semiconductor wafer, and the ESD prevention layer covers the surface of the wafer handling structure and, in use, contacts the entire surface of the semiconductor wafer.

10. The semiconductor processing apparatus of claim 1 wherein the ESD prevention layer covers a surface of the wafer handling structure that is configured to support the semiconductor wafer during processing of the semiconductor wafer.

11. A method, comprising:
receiving, by a load port of a semiconductor processing apparatus, a semiconductor wafer in a Front Opening Unified Pod (FOUP);
transferring, by first robotic wafer handling structure, the semiconductor wafer to a first processing chamber of the semiconductor processing apparatus;
prior to returning the semiconductor wafer to the FOUP, contacting, by the semiconductor wafer, at least one electrostatic discharge (ESD) prevention layer including a first material and a second material, the second material having an electrical conductivity that is greater than an electrical conductivity of the first material, the at least one ESD prevention layer being disposed on at least one of the FOUP, the first robotic wafer handling structure, or a first wafer stage of the first processing chamber;
wherein the second material comprises conductive particles having a particle size that is less than about 10 μm,
transferring, by a second robotic wafer handling structure, the semiconductor wafer from the load port to a wafer orientor, the wafer orientor having a surface at least partially covered by a second ESD prevention layer; and
contacting, by the semiconductor wafer, the second ESD prevention layer prior to the returning the semiconductor wafer to the FOUP.

12. The method of claim 11 wherein the second material includes conductive particles having a size that is less than a thickness of the first material.

13. The method of claim 12 wherein the thickness of the first material is at least 1 μm, and the size of the conductive particles of the second material is less than 500 nm.

14. The method of claim 11 wherein the at least one ESD prevention layer is provided on each of the FOUP, the first robotic wafer handling structure, and the first wafer stage.

15. The method of claim 11, further comprising:
a buffer chamber positioned adjacent to the process chamber, the buffer chamber including a second robotic wafer handling structure configured to transport the semiconductor wafer to the process chamber; and
a load lock positioned between the first robotic wafer handling structure and the buffer chamber, the load lock including a second wafer stage,
wherein the at least one ESD prevention layer is provided on at least one of the second robotic wafer handling structure or the second wafer stage.

16. A method, comprising:
receiving, by a load port of a semiconductor processing apparatus, a semiconductor wafer in a Front Opening Unified Pod (FOUP);
transferring, by a first robotic wafer handling structure, the semiconductor wafer to a first process chamber of the semiconductor processing apparatus;
processing the semiconductor wafer in the first process chamber, the first process chamber including a first wafer stage configured to support the semiconductor wafer; and
prior to returning the semiconductor wafer to the FOUP, contacting, by the semiconductor wafer, at least one electrostatic discharge (ESD) prevention layer including a first material and a second material, the second material having an electrical conductivity that is greater than an electrical conductivity of the first material, the at least one ESD prevention layer being disposed on at least one of the FOUP, the first robotic wafer handling structure, or the first wafer stage,
transferring, by the first robotic wafer handling structure, the semiconductor wafer from the first process chamber to a load lock, subsequent to the processing the semiconductor wafer in the first process chamber, the load lock including a second wafer stage and a second ESD prevention layer on the second wafer stage;
transferring, by a second robotic wafer handling structure, the semiconductor wafer from the load lock to a third wafer stage positioned between the load port and the load lock, the third wafer stage being at least partially covered by a third ESD prevention layer; and
measuring, by a metrology device positioned over the third wafer stage, at least one parameter of the semiconductor wafer;
wherein the ESD prevention layer includes a homogeneous mixture of the first material and the second material.

17. The method of claim 16, wherein the first material is at least one of a polymer or a resin material.

18. The method of claim 16, wherein the second material includes conductive particles having a size that is less than a thickness of the first material.

19. The method of claim 16 wherein the first material is at least one of a polymer or a resin material.

20. The method of claim 16 wherein the semiconductor processing apparatus comprises at least one of a physical vapor deposition (PVD) apparatus, an etching apparatus, a chemical vapor deposition (CVD) apparatus, or a lithography apparatus.

* * * * *